(12) United States Patent
Yoshida et al.

(10) Patent No.: US 7,804,439 B2
(45) Date of Patent: Sep. 28, 2010

(54) ELECTROMAGNETIC WAVE ABSORBER

(75) Inventors: Takahiko Yoshida, Yamatokoriyama (JP); Haruhide Go, Yamatokoriyama (JP); Yoshiharu Kiyohara, Yamatokoriyama (JP); Shinichi Sato, Yamatokoriyama (JP); Makoto Maezawa, Yamatokoriyama (JP); Mamoru Maenaka, Yamatokoriyama (JP)

(73) Assignee: Nitta Corporation, Osaka (JP)

( * ) Notice: Subject to any disclaimer, the term of this patent is extended or adjusted under 35 U.S.C. 154(b) by 211 days.

(21) Appl. No.: 10/591,539

(22) PCT Filed: Mar. 1, 2004

(86) PCT No.: PCT/JP2004/002503

§ 371 (c)(1),
(2), (4) Date: Nov. 15, 2007

(87) PCT Pub. No.: WO2005/084096

PCT Pub. Date: Sep. 9, 2005

(65) Prior Publication Data

US 2008/0084259 A1    Apr. 10, 2008

(51) Int. Cl.
*H01Q 17/00* (2006.01)
(52) U.S. Cl. ............................................ 342/4; 342/1
(58) Field of Classification Search ..................... 342/1, 342/4, 2, 3
See application file for complete search history.

(56) References Cited

U.S. PATENT DOCUMENTS

| | | | | |
|---|---|---|---|---|
| 3,887,920 A * | 6/1975 | Wright et al. | ................... | 342/1 |
| 4,814,785 A * | 3/1989 | Wu | ............................. | 343/909 |
| 5,223,849 A * | 6/1993 | Kasevich et al. | ............ | 343/895 |
| 5,384,575 A * | 1/1995 | Wu | ............................. | 343/909 |
| 5,453,328 A | 9/1995 | Nagano et al. | | |
| 5,455,116 A | 10/1995 | Nagano et al. | | |
| 5,576,710 A * | 11/1996 | Broderick et al. | ............... | 342/1 |
| 5,627,541 A | 5/1997 | Haley et al. | | |
| 5,855,988 A | 1/1999 | Matsuo | | |

(Continued)

FOREIGN PATENT DOCUMENTS

EP    0539297    4/1993

(Continued)

OTHER PUBLICATIONS

Ultra-thin electromagnetic bandgap absorbers synthesized via genetic algorithms Kern, D.J.; Werner, D.H.; Antennas and Propagation Society International Symposium, 2003. IEEE vol. 2, Jun. 22-27, 2003 pp. 1119-1122 vol. 2.*

(Continued)

*Primary Examiner*—Thomas H Tarcza
*Assistant Examiner*—Cassi Galt
(74) *Attorney, Agent, or Firm*—Harness, Dickey & Pierce, P.L.C.

(57) ABSTRACT

A thin, light and soft electromagnetic wave absorber is disclosed exhibiting an excellent workability. The first conductor element group of a first conductor element layer consists of aligned cross conductor elements and square conductor elements in regions surrounded by cross conductor elements. A radio wave incident from the first conductor element layer side is received by each element, internally subjected to multiple reflection and then absorbed by a first loss material layer. Since the first conductor element group is realized by the cross conductor elements and the square conductor elements, receiving effect is enhanced and the radio wave can be collected with a high collection efficiency.

19 Claims, 17 Drawing Sheets

U.S. PATENT DOCUMENTS

| | | | |
|---|---|---|---|
| 5,940,022 A * | 8/1999 | Takatsu | 342/1 |
| 5,949,387 A * | 9/1999 | Wu et al. | 343/909 |
| 6,057,796 A * | 5/2000 | Kotsuka | 342/1 |
| 6,147,302 A | 11/2000 | Matsuo et al. | |
| 6,225,939 B1 * | 5/2001 | Lind | 342/4 |
| 6,337,661 B1 * | 1/2002 | Kondoh et al. | 343/700 MS |
| 6,900,763 B2 * | 5/2005 | Killen et al. | 343/700 MS |

FOREIGN PATENT DOCUMENTS

| | | | |
|---|---|---|---|
| EP | 1195847 A | | 4/2002 |
| GB | 2163296 A | * | 2/1986 |
| JP | 06-045782 | | 2/1994 |
| JP | 06-140787 | | 5/1994 |
| JP | 06-164184 | | 6/1994 |
| JP | 06-224586 | | 8/1994 |
| JP | 06-244583 | | 9/1994 |
| JP | 06-252582 | | 9/1994 |
| JP | 08-274538 | | 10/1996 |
| JP | 09-148782 | | 6/1997 |
| JP | 09-289392 | | 11/1997 |
| JP | 10-224075 | | 8/1998 |
| JP | 11-163585 | | 6/1999 |
| JP | 11-195890 | | 7/1999 |
| JP | 11-204984 | | 7/1999 |
| JP | 2000-196288 | | 7/2000 |
| JP | 2002-076670 | | 3/2002 |
| JP | 2002-076678 | | 3/2002 |
| JP | 2002-368479 | | 12/2002 |
| JP | A 2003-69278 | | 3/2003 |
| JP | 2003-243876 | | 8/2003 |
| JP | 2004-063719 | | 2/2004 |
| JP | 2004140194 A | * | 5/2004 |

OTHER PUBLICATIONS

Machine translation of JP 2004140194 to Okano, May 2004.*
Office Action for corresponding Japanese Application No. 2006-510370 dated Mar. 6, 2007.
"Investigation on the Matching Characteristics of EM-Wave Absorber Mounted Conductive Patterns". Mitsuhiro Amano et al. The Institute of Electronics, Information and Communication Engineers, vol. 102, No. 406, Oct. 18, 2002, pp. 13-17.
International Search Report (PCT/ISA/210).
Supplementary European Search Report Sep. 29, 2008.

* cited by examiner

FIG. 16
(1) INCIDENT ANGLE OF ELECTROMAGNETIC WAVES —— 10° ······ 30° —— 45°
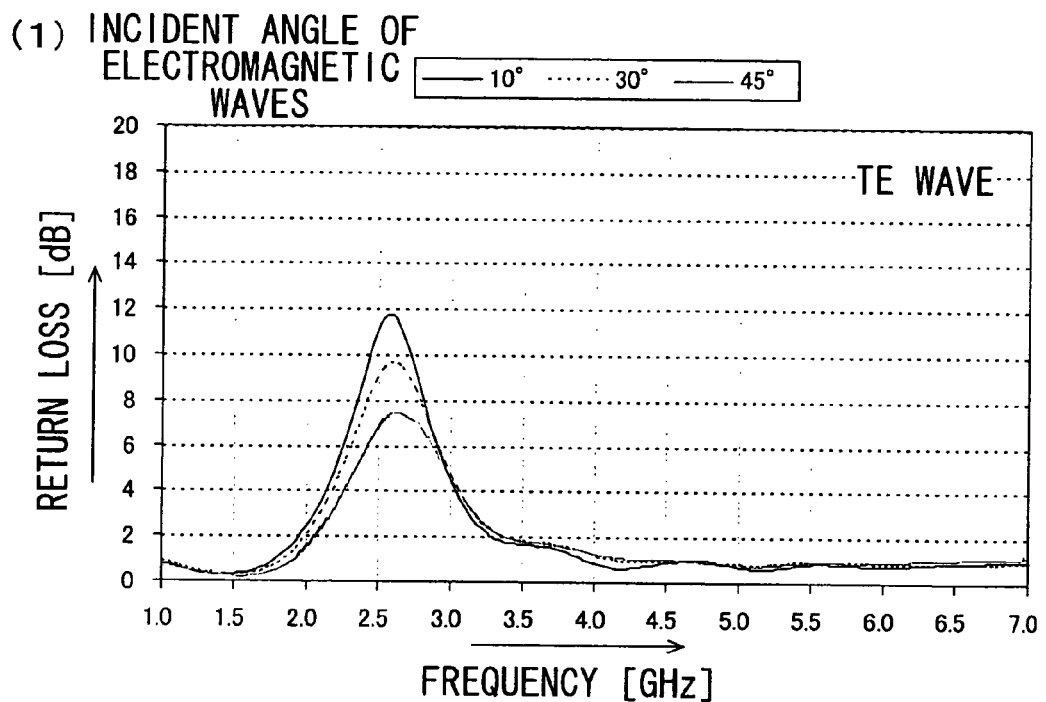
(2) INCIDENT ANGLE OF ELECTROMAGNETIC WAVES —— 10° ······ 30° —— 45°
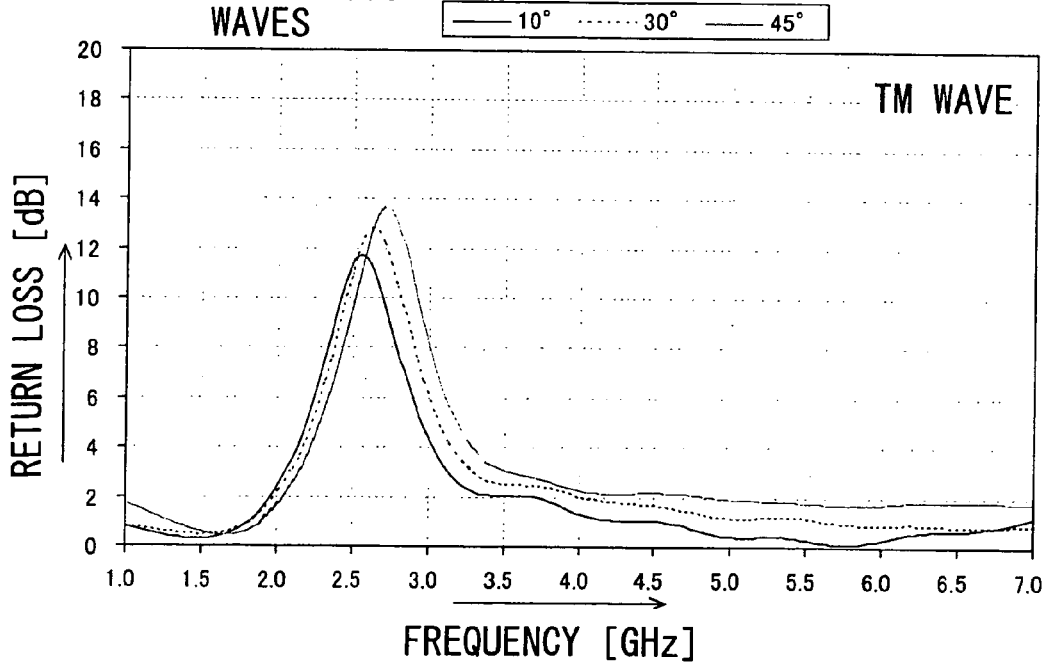

ELECTROMAGNETIC WAVE ABSORBER

PRIORITY STATEMENT

This application is the national phase under 35 U.S.C. §371 of PCT International Application No. PCT/JP2004/002503 which has an International filing date of Mar. 1, 2004, which designated the United States of America, the entire contents of which are hereby incorporated herein by reference.

TECHNICAL FIELD

The present invention generally relates to an electromagnetic wave absorber used for improving an electromagnetic environment in space such as offices.

BACKGROUND ART

Currently, in the architecture of LANs (local area networks) on computer networks, communication systems with better flexibility and higher mobility have been developed using, for example, wireless LANs with micro waves. Furthermore, a short-range wireless technology called Bluetooth, which is said to represent a WPAN (wireless personal area network), is used instead of wired cables. In an environment in which a large number of such technologies are used together with one another, there are problems in that electromagnetic waves interfere with each other when electromagnetic waves in the same band are used or in that transmission errors (multi-path) are caused by reflected waves and the like. More specifically, the transmission speed between equipment using the wireless technologies is lowered, and BER (bit error rate) is deteriorated, and in the worst case, the equipment may malfunction.

In order to solve these problems, conventionally, magnetic loss materials represented by ferrite and dielectric loss materials represented by carbon black, for example, have been used as electromagnetic wave absorbing materials. In order to supply these electromagnetic wave absorbing materials, electromagnetic wave absorbers having a predetermined complex relative dielectric constant and complex relative permeability have been developed. In this conventional technique, for example, when an electromagnetic wave absorber is realized using ferrite as a constituent in the 2.45 GHz band of a wireless LAN and the like, there is a problem in that due to the restriction of the snoek peak, it is usually impossible to reduce the thickness of the electromagnetic wave absorbing material to 4 mm or less.

As other conventional techniques, multi-layered electromagnetic wave absorbers including patterned layers have been disclosed in Japanese Unexamined Patent Publication JP-A 06-164184 (1994), Japanese Patent No. 3076473 (Japanese Unexamined Patent Publication JP-A 06-244583 (1994)), Japanese Patent No. 3209456 (Japanese Unexamined Patent Publication JP-A 06-140787 (1994)), Japanese Patent No. 3209453 (Japanese Unexamined Patent Publication JP-A 06-45782 (1994)), Japanese Unexamined Patent Publication JP-A 06-252582 (1994), Japanese Unexamined Patent Publication JP-A 06-224586 (1994), and Japanese Unexamined Patent Publication JP-A 09-148782 (1997). An electromagnetic wave absorber having a patterned layer based on a conductor loop structure has been disclosed in Japanese Unexamined Patent Publication JP-A 10-224075 (1998). Furthermore, a plurality of resonant frequency selective electromagnetic wave blocking planar members are described in Japanese Unexamined Patent Publication JP-A 11-204984 (1999) and Japanese Unexamined Patent Publication JP-A 11-195890 (1999). Moreover, a method for designing the shape of patterns and the like is described in Japanese Unexamined Patent Publication JP-A 2003-243876.

In JP-A 06-164184, a radio wave reflection preventing member using a patterned metal layer is described. In order to leave a space between molded sheet layers, this radio wave reflection preventing member has a configuration in which paper, cloths, non-woven fabrics or porous sheets are impregnated with paint containing a material such as ferrite and carbon. Thus, this technique is different from the invention in which these impregnated members are not used. Similar configurations are described as patterned resin layers also in JP-A 06-252582 and JP-A 06-224568, but these configurations are also different from that of at least one embodiment of the invention.

In Japanese Patent No. 3076473 (JP-A 06-244583), a radio wave absorber is described in which a set of a patterned layer and a resin layer is taken as one unit and this unit is repeated for a plurality of times. It is described that in the radio wave absorber, at least one coating film is used as the patterned layer, and thus this technique is different from at least one embodiment of the invention in which an element made of metal is used and there is a limitation regarding the conductivity.

In Japanese Patent No. 3209456 (JP-A 06-140787), a laminated layer member made of a patterned layer and a resin layer is described. This laminated layer member has a configuration in which patterned structures are piled up, and is different from at least one embodiment of the invention in the shape of an element. A similar configuration is described also in Japanese Patent No. 3209453 (JP-A 06-45782), but this form is also different from at least one embodiment of the invention in the shape of an element.

In JP-A 09-148782, JP-A 10-224075, JP-A 11-204984, and JP-A 11-195890, configurations are described in which a patterned layer and an insulation spacer material that may be a space are laminated. In these laminated configurations, a loss component based on thermal conversion such as a dielectric loss material or a magnetic loss material is not used, and thus this technique is different from at least one embodiment of the invention. Since the absorption frequency is controlled only with the shape of patterns and the interval of spacers, when the thickness of the spacers is changed by the incident angle of radio waves, the oblique incident property becomes poor.

In JP-A 2003-243876, a theoretical design method is described in which an approximate analysis is conducted on the shape of patterns and the constituents of a radio wave absorber using the FDTD method. However, this method involves various factors to be calculated, and when actually combined with a material used as an architectural interior material with a different complex relative dielectric constant, for example, it is complicated to change the design.

As described in JP-A 06-164184, Japanese Patent No. 3076473 (JP-A 06-244583), Japanese Patent No. 3209456 (JP-A 06-140787), Japanese Patent No. 3209453 (JP-A 06-45782), JP-A 06-252582, JP-A 06-224568, JP-A 09-148782, JP-A 10-224075, JP-A 11-204984, JP-A 11-195890, and JP-A 2003-243876, as a radio wave absorber that can be made thinner and lighter, a patterned radio wave absorber provided with a patterned layer is conceivable, and has been put to practical use as a far-field electromagnetic wave absorber. Herein, the ability to absorb radio waves conflicts with the ability to be thinner and strong. It is difficult to make an absorber thin and to sustain a high strength thereof while keeping a high absorbing ability. In particular, for an electromagnetic wave absorber for absorbing radio waves with a lower frequency such as 1 to 3 GHz, it is necessary that the absorber layer is thick, and thus it is difficult to make the absorber thinner and lighter, and to attain softness and processability in being cut on the spot.

When providing the ability to absorb electromagnetic waves in an architectural interior material such as a ceiling material, a wall material, and a screen, emphasis is put on the workability and the required specification in terms of cost, and thus it is necessary that the electromagnetic wave absorber is thinner, lighter, softer and less expensive to the extent possible. In particular, when a wireless LAN is actually used, metal racks, posts, or air conditioners that have been conventionally present act as electromagnetic wave reflecting layers, and thus there are spots with poor wireless communications. In this case, covering a portion exerting an influence on the wireless communication environment with an electromagnetic wave absorbing member is effective in improving communications, but conventional techniques cannot provide a radio wave absorber that is thin, light, soft, and excellent in the strength and workability while having a high ability to absorb radio waves.

SUMMARY

It is an object of at least one embodiment of the invention to provide an electromagnetic wave absorber that is thin, light, soft, and excellent in the strength and workability while having a high ability to absorb electromagnetic waves.

At least one embodiment of the invention is directed to an electromagnetic wave absorber, comprising:

element receiving means provided with a plurality of conductor elements having predetermined resonant frequencies and including a plurality of types of conductor elements that perform different receiving operations, the plurality of conductor elements being arranged spaced away from each other in a direction intersecting an incoming direction of electromagnetic waves, and the plurality of conductor elements being substantially polygonal and having at least one corner portion of an arc shape having a curvature radius corresponding to the resonant frequencies; and a loss material for causing energy loss to electromagnetic waves, provided close to the element receiving means.

According to at least one embodiment of the invention, element receiving means is configured by arranging a plurality of conductor elements in the direction intersecting the incoming direction of electromagnetic waves. With this element receiving means, it is possible to efficiently receive electromagnetic waves with the same frequency as the resonant frequencies of the conductor elements. A loss material is provided close to the element receiving means, and causes energy loss to electromagnetic waves that are received by the element receiving means. In other words, the energy of electromagnetic waves can be converted into thermal energy and absorbed. By using the element receiving means in this manner, it is possible to efficiently receive and absorb electromagnetic waves. Furthermore, not one type of conductor elements, but a plurality of types of conductor elements are provided. Thus, it is possible to efficiently receive and efficiently absorb electromagnetic waves taking advantage of the property of each element. It is possible to improve the absorption efficiency of electromagnetic waves in this manner, and thus a high ability to absorb electromagnetic waves can be obtained, an absorber can be made thinner and lighter, and the degree of freedom in selecting materials for the loss material is increased, so that it is possible to obtain an electromagnetic wave absorber that is flexible and excellent in the strength and workability. The loss material may be a dielectric loss material or may be a magnetic loss material, or may be a combination obtained by laminating these loss materials.

The electromagnetic wave absorber may have a configuration in which electromagnetic wave reflecting means made of a conductive material is provided on a surface portion opposite to the side from which electromagnetic waves income, or may be used in such a manner that the surface portion on the opposite side is in contact with a structure (functioning as a conductive reflecting layer) made of a conductive material. The resonant frequencies of the conductor elements may be the same or different. When all of the resonant frequencies of the conductor elements are the same, it is possible to improve the absorption efficiency of electromagnetic waves with the same frequency as the resonant frequencies. Furthermore, when the resonant frequencies of the conductor elements are different from each other, for example, when the resonant frequency is different for each type of the conductor elements, it is possible to absorb electromagnetic waves with the plurality of frequencies, and thus absorption in a wide band can be realized.

Herein, a difference between at least one embodiment of the invention and conventional techniques is described. Radio wave absorbers using patterned layers in conventional techniques are based on absorption principles (1) conversion of radio waves into heat using an absorbing layer that causes dielectric loss or magnetic loss, and (2) extinction of radio waves due to an interference effect using the phase difference between radio waves that are reflected by a surface pattern and radio waves that are reflected by a conductive reflecting plate.

In principle, it is a conventional design method in which the property of absorbing electromagnetic waves is exerted by forming an equivalent circuit with a model of a transmission line and letting the input impedance be close to 377Ω. Herein, the shape of a pattern is determined based on the assumption that since a foreign substance i.e. the pattern is on a surface on which electromagnetic waves are input, an effect is obtained that is the same as the effect of reducing the thickness of the absorber in the equivalent circuit. In this case, when the shape of the pattern is simple, modeling as an equivalent circuit is easy, but when the shape is complicated, it is theoretically difficult to form an equivalent circuit, and thus it is difficult to optimize the shape of the pattern.

At least one embodiment of the invention is different from conventional techniques in that when determining the shape of the surface element, an optimization method based on a design principle for receiving elements is used. More specifically, in at least one embodiment of the invention, not simply as a pattern, but as the shape with which elements operate as receiving elements that efficiently resonate with a predetermined frequency is designed, and when the receiving elements are used as conductor elements, it is possible to receive electromagnetic waves more efficiently.

In the design of general-purpose receiving elements, in order to secure the directivity of receiving elements, except when a conductive reflecting layer close to a patch antenna is used, the receiving elements are generally designed as being in free space, and thus a material having a loss property is not used in the vicinity thereof, and a conductive reflecting layer is not provided close thereto. The reason for this is that in particular, when a conductive reflecting layer is provided close thereto, a capacitor with a large capacity is formed between the conductor elements and the conductive reflecting layer, and this capacitor exerts an influence on the resonant frequency, and it is very difficult to eliminate this influence.

On the other hand, when the electromagnetic wave absorber is not provided with a conductive reflecting layer, in a case where the radio wave absorbing member is disposed (laminated) on building interior materials for example, the influence of a difference in the dielectric constant between the building interior materials such as a ceiling material, a wall material, and a screen changes the resonant frequency. More specifically, the resonant frequency of the receiving elements is changed at each arrangement location, and thus the electromagnetic wave absorber cannot be used as an electromagnetic wave absorber corresponding to the frequency that was assumed at the time of designing. Thus, as described above, it is preferable that the electromagnetic wave absorber has a configuration in which electromagnetic wave reflecting means made of a conductive material is provided on a surface portion opposite to the side from which electromagnetic waves income, or is used in such a manner that the surface portion on the opposite side is in contact with a structure (functioning as a conductive reflecting layer) made of a conductive material. Accordingly, it is possible to secure a stable resonant frequency. More specifically, in at least one embodiment of the invention, conductor elements are formed on the assumption that a conductive reflecting layer is provided in this manner.

It is the design method of at least one embodiment of the invention that when it is intended to make the electromagnetic wave absorber thinner, under the conditions that the conductor elements and the conductive reflecting layer are closer to each other, and that a loss material corresponding to a specific frequency such that electromagnetic waves received by the conductor elements are converted into heat is provided close to the conductor elements, the optimization as receiving elements is designed in consideration of the influence thereof.

In the configuration of the electromagnetic wave absorber of at least one embodiment of the invention, a (magnetic) loss material layer can be made thinner to the extent possible, based on theoretical basis below and supporting experiments illustrating the theoretical basis shown in examples below.

As described in Background Art, a large number of methods for realizing the property of absorbing electromagnetic waves by providing conductor elements of various shapes in a (magnetic) loss material (electromagnetic wave absorber) have been conventionally proposed.

On the other hand, in at least one embodiment of the invention, an in-depth research was conducted using the FDTD analysis method on the input impedance property with which the electromagnetic wave absorber with the configuration of at least one embodiment of the invention may be realized, among a number of conceivable shapes of conductor elements, and a new configuration of conductor elements that is totally different from conventional configurations was found in which based on the correlation between the surface of a (magnetic) loss material layer and conductor elements provided on the rear face thereof, it is possible to make the absorber thinner even when using a magnetic material having an ordinary permeability property as the (magnetic) loss material. More specifically, in the electromagnetic wave absorber of this configuration, conductor elements as cross conductor elements and quadrangular conductor elements are cyclically arranged with a predetermined spacing interposed therebetween, and are attached to the surface of the electromagnetic wave absorber on the side from which electromagnetic waves income, conductor elements with the same or different shape from that of the conductor elements on the surface are attached to the back face of the (magnetic) loss material, and the (magnetic) loss material is made thinner to the extent possible.

In the above-described configuration of at least one embodiment of the invention, as the size of the conductor elements is increased, in the input admittance of the electromagnetic wave absorber from the side from which electromagnetic waves income, the susceptance component of the admittance is increased, and the matching frequency is shifted toward a lower frequency. As shown in the results, it is possible to make the electromagnetic wave absorber thin. However, in the technique of at least one embodiment of the invention, the (magnetic) loss material can be thinner than in conventional techniques, that is, can be thinner to the extent possible using following means.

Hereinafter, the configuration principle of the electromagnetic wave absorber based on the configuration of conductor elements of at least one embodiment of the invention is described taking as an example a configuration in which conventional conductor elements made only of cross-shaped portions are attached to the surface and square conductor patterns are attached to the back face thereof. In the case of the cross conductor elements only, as the size of the conductor elements is increased, in the change in the input admittance of the electromagnetic wave absorber from the side from which electromagnetic waves income shown on the Smith chart, the rate of increase in the susceptance component is large. Furthermore, as the frequency is changed toward a higher frequency in this case, the conductance tends to be increased with respect to a circle with a conductance of 1. On the other hand, in the configuration of at least one embodiment of the invention in which cross conductor elements and quadrangular conductor elements are provided, even when these conductor elements are enlarged at the same time, the rate of change in the susceptance component of the input admittance is smaller than in the cross-shaped structure, that is, other conductor elements. Furthermore, the rate of increase in the conductance component with respect to a circle with a conductance of 1 is small with respect to change in the frequency toward a higher frequency. More specifically, in the case of at least one embodiment of the invention, with respect to the change in the frequency toward a higher frequency, the conductance is stable without significantly deviating from the circumference with the normalized conductance 1. This stability itself in staying on the circumference with a conductance of 1 serves as the basis for enabling the (magnetic) loss material to be thinner in the configuration of conductor elements of at least one embodiment of the invention.

In this manner, after securing the stability of the conductance, as one means for adjusting the susceptance in this case, the size of the conductor elements that are attached to the back face of the (magnetic) loss material is adjusted and the shape of the conductor elements is selected. More specifically, in order to attain the matching at a lower frequency, the amount of the susceptance increased by increasing the size of the conductor elements is reduced by the conductor elements that are attached to the back face of the (magnetic) loss material. In other words, the conductor elements that are attached to the back face of the (magnetic) loss material play a role to adjust so as to attain the matching at a low frequency by restoring the amount of the susceptance on the circumference with a conductance of 1 increased as the frequency becomes higher. Accordingly, when it is not necessary to control the susceptance, the conductor elements on the back face of the (magnetic) loss material are not always necessary.

Furthermore, by forming corner portions in the shape of arcs, it is possible to improve the absorption efficiency of electromagnetic waves with the same frequency as the corresponding resonant frequencies. Accordingly, it is possible to realize the electromagnetic wave absorber that is thin and has a high absorption efficiency.

Furthermore, in at least one embodiment of the invention, it is preferable that the conductor elements are arranged also in the incoming direction of electromagnetic waves, in addition to the direction intersecting the incoming direction of electromagnetic waves.

According to at least one embodiment of the invention, the conductor elements are arranged also in the incoming direction of electromagnetic waves. Since the conductor elements are arranged three-dimensionally, that is, sterically in this manner, the electrostatic capacity in the electromagnetic wave absorber is increased, so that the apparent dielectric constant can be increased. Accordingly, the resonant frequencies of the conductor elements can be shifted toward a lower frequency, and as a result, the total thickness of the electromagnetic wave absorber can be further reduced. More specifically, in the electromagnetic wave absorber, there is a correlation between frequency and thickness in that as electromagnetic waves that are to be absorbed come to have a lower frequency (longer wave length), it is necessary to increase the thickness. On the other hand, in at least one embodiment of the invention, the resonant frequencies can be shifted toward a lower frequency, and thus it is possible to absorb electromagnetic waves with a low frequency while keeping the total thickness small. The three-dimensional arrangement of the conductor elements is one specific means for obtaining an effect of lowering the resonant frequencies of the conductor elements.

Furthermore, in at least one embodiment of the invention, it is preferable that the electromagnetic wave absorber further comprises electromagnetic wave reflecting means for reflecting electromagnetic waves, disposed on a side opposite to a side from which electromagnetic waves income with respect to the element receiving means.

According to at least one embodiment of the invention, a conductive reflecting layer is provided. Thus, the resonant frequencies of the conductor elements are prevented from being changed by the influence of a location at which the electromagnetic wave absorber is disposed. For example, even when the electromagnetic wave absorber is provided in a building interior material, it is possible to prevent the resonant frequencies of the conductor elements from being changed by the influence of factors such as the dielectric constant of the interior material.

Furthermore, in at least one embodiment of the invention, it is preferable that a conductivity of the conductor elements is at least 10,000 S/m.

According to at least one embodiment of the invention, it is possible to increase the conductivity of the conductor elements and to improve the receiving efficiency. As the conductor elements, various materials such as metal and conductive ink can be used, but there is a limitation regarding the conductivity. When the conductivity is less than 1,000 S/m, a function as the conductor elements in at least one embodiment of the invention cannot be obtained.

Furthermore, in at least one embodiment of the invention, it is preferable that the conductor elements are made of metal.

According to at least one embodiment of the invention, the conductor elements are made of metal. It is impossible to stably attain a conductivity of at least 10,000 S/m described above in conductive ink made of carbon or black lead. Thus, the conductor elements made of metal are most preferable.

Furthermore, in at least one embodiment of the invention, it is preferable that the electromagnetic wave absorber is formed in the shape of a sheet having a thickness of at least 0.1 mm and at most 4 mm.

According to at least one embodiment of the invention, the thickness is at least 0.1 mm and at most 4 mm. When the thickness is more than 4 mm, there is a problem in making the absorber thinner and lighter, and the flexibility is lowered. When the thickness is less than 0.1 mm, the strength is lowered. On the other hand, when the thickness is at least 0.1 mm and at most 4 mm, it is possible to realize the electromagnetic wave absorber that is thin, light, highly flexible, and excellent in the strength. Accordingly, it is possible to realize the electromagnetic wave absorber that can be easily handled, is excellent in the workability, and has less limitation regarding the arrangement location.

Furthermore, in at least one embodiment of the invention, it is preferable that the electromagnetic wave absorber is formed in the shape of a sheet having a mass per unit area of at least $0.2$ $kg/m^2$ and at most 5 $kg/m^2$.

According to at least one embodiment of the invention, the mass is at least 0.2 $kg/m^2$ and at most 5 $kg/m^2$. When the mass is more than 5 $kg/m^2$, there is a problem in making the absorber thinner and lighter, and the thickness is increased and the flexibility is lowered. When the mass is less than 0.2 $kg/m^2$, the thickness is so small that the strength is lowered. On the other hand, when the mass is at least 0.2 $kg/m^2$ and at most 5 $kg/m^2$, it is possible to realize the electromagnetic wave absorber that is thin, light, highly flexible, and excellent in the strength. Accordingly, it is possible to realize the electromagnetic wave absorber that can be easily handled, is excellent in the workability, and has less limitation regarding the arrangement location.

Furthermore, in at least one embodiment of the invention, it is preferable that among the plurality of types of the conductor elements, one type of the conductor elements are cross conductor elements that are formed in the shape of crosses, and another type of the conductor elements are quadrangular conductor elements that are formed in the shape of planes, the cross conductor elements and the quadrangular conductor elements are arranged in the direction intersecting the incoming direction of electromagnetic waves, the cross conductor elements are arranged in a regular manner in the direction intersecting the incoming direction of electromagnetic waves, and the quadrangular conductor elements are arranged in areas surrounded by the cross conductor elements so as to fill in the areas.

According to at least one embodiment of the invention, cross conductor elements that are formed in the shape of crosses and that are arranged in a regular manner with a spacing interposed therebetween, and quadrangular conductor elements that are arranged away from the cross conductor elements in areas surrounded by the cross conductor elements and that are provided so as to fill in the areas surrounded by the cross conductor elements are provided. The length of the elements is optimized such that the cross conductor elements resonate with electromagnetic waves that are to be absorbed. The outer peripheral length of the quadrangular conductor elements is optimized such that the quadrangular conductor elements resonate with electromagnetic waves that are to be absorbed. In this manner, it is possible to realize the element receiving means for efficiently absorbing electromagnetic waves.

Both the cross conductor elements and the quadrangular conductor elements are resonant receiving elements, and resonate in a basic mode and in a higher mode. Different resonant modes of the conductor elements are also included in the different receiving operations of at least one embodiment of the invention. The cross conductor elements are formed in the shape of crosses, but a similar effect can be obtained even in the shape in which the configuration is divided into lines, and the independent lines are arranged. The receiving elements that are combined with the cross conductor elements are not limited to quadrangular elements, and loop-shaped elements and the like can be also used.

Furthermore, in at least one embodiment of the invention, it is preferable that the cross conductor elements are arranged such that radially extending portions are faced with each other, and the quadrangular elements are formed in the shape corresponding to the areas surrounded by the cross conductor elements.

According to at least one embodiment of the invention, the cross conductor elements are arranged such that radially extending portions are faced with each other, and the quadrangular elements are formed in the shape corresponding to the areas surrounded by the cross conductor elements. This arrangement provides an optimum (high) receiving efficiency in the combination of the cross conductor elements and the quadrangular conductor elements. Accordingly, it is possible to realize the electromagnetic wave absorber with a high receiving efficiency.

Furthermore, in at least one embodiment of the invention, it is preferable that a size of a spacing between the conductor elements is determined so as to lower the resonant frequencies of the conductor elements.

According to at least one embodiment of the invention, the resonant frequencies of the conductor elements can be shifted toward a lower frequency. Thus, it is possible to absorb electromagnetic waves with a low frequency while keeping the total thickness small. Accordingly, it is possible to make the electromagnetic wave absorber thinner. This is more specific means for obtaining an effect of lowering the resonant frequencies of the conductor elements.

Furthermore, in at least one embodiment of the invention, it is preferable that a property value of the loss material is determined based on the resonant frequencies of the conductor elements so as to improve the absorption efficiency of electromagnetic waves with the same frequency as the resonant frequencies.

According to at least one embodiment of the invention, it is possible to obtain the electromagnetic wave absorber with a high absorption efficiency of electromagnetic waves.

Furthermore, in at least one embodiment of the invention, it is preferable that the electromagnetic wave absorber is made flame resistant, quasi-incombustibile, or incombustibile.

According to at least one embodiment of the invention, flame resistance, quasi-incombustibility, or incombustibility can be attained. When the absorber is used in or laminated on an architectural interior material, it is necessary to satisfy at the same time flame resistance, quasi-incombustibility, or incombustibility required for the architectural interior material. With this aspect, the absorber can be preferably used in or laminated on the building interior material. The flame resistance, the quasi-incombustibility, or the incombustibility may be provided by adding a flame retardant or a flame retardant assistant, for example.

Furthermore, at least one embodiment of the invention is directed to a method for absorbing electromagnetic waves by using the electromagnetic wave absorber.

According to at least one embodiment of the invention, it is possible to absorb electromagnetic waves at a high absorption efficiency using the electromagnetic wave absorber.

BRIEF DESCRIPTION OF THE DRAWINGS

Other and further objects, features, and advantages of embodiments of the invention will be more explicit from the following detailed description taken with reference to the drawings wherein:

FIG. 16 shows graphs of the property of absorbing electromagnetic waves (measured values) of the electromagnetic wave absorber 1 in Example 1.

DETAILED DESCRIPTION OF THE EXAMPLE EMBODIMENTS

Figure 1:
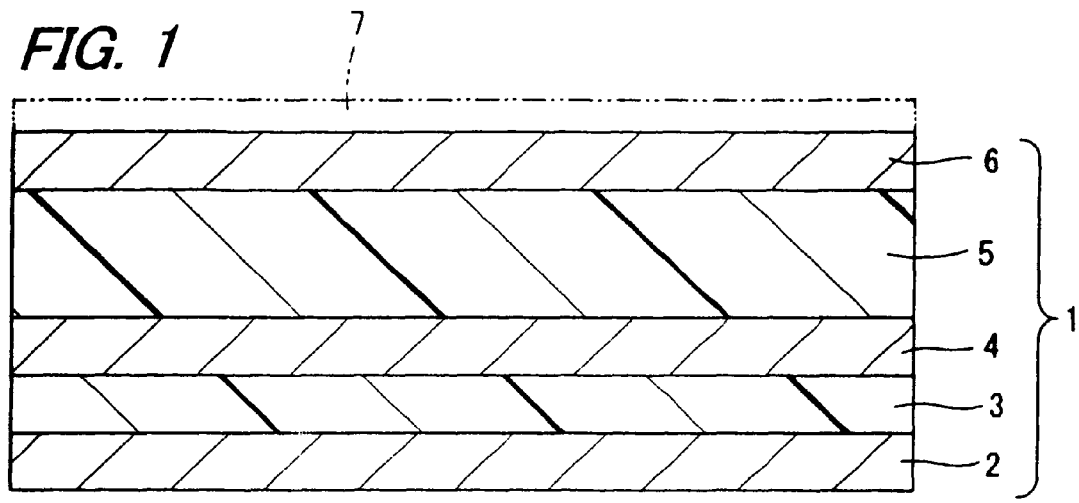
FIG. 1 is a front view of an electromagnetic wave absorber 1 that is an embodiment of the invention.

Now referring to the drawings, example embodiments of the invention are described below.

Hereinafter, example embodiments of an electromagnetic wave absorber according to the invention are described with reference to the appended drawings. FIG. 1 is a cross-sectional view of an electromagnetic wave absorber 1 that is an embodiment of the invention. The electromagnetic wave absorber 1 is configured by laminating a first conductor element layer 6, a first loss material layer 5, and an electromagnetic wave reflecting plate 2 that is an electromagnetic wave reflecting layer in this order from the side from which electromagnetic waves income, which is on the upper side in FIG. 1 that is one side in the thickness direction (laminating direction). A first conductor element group 12 including two types of a plurality of conductor elements 30 and 31 made of metal is formed in the first conductor element layer 6 as described below, and it is possible to reduce the thickness of the electromagnetic wave absorber 1 by optimizing the correlation between the conductor elements 30 and 31, thereby making the first loss material layer 5 thin. A surface layer 7 that does not reflect electromagnetic waves may be further formed on the first conductor element layer 6 on the side (upper side in FIG. 1) from which electromagnetic waves income.

The electromagnetic wave absorber 1 further has a second conductor element layer 4 and a second loss material layer 3. The layers 2 to 6 are laminated in the order of the first conductor element layer 6, the first loss material layer 5, the second conductor element layer 4, the second loss material layer 3, and the electromagnetic wave reflecting plate 2 from the side from which electromagnetic waves income, and the electromagnetic wave absorber 1 is configured by this laminated structure. A second conductor element group 18 including a plurality of conductor elements 19 made of metal described below is formed in the second conduct or element layer 4. It is possible to reduce the thickness of the electromagnetic wave absorber 1 by optimizing the correlation between the conductor elements 19, 30, and 31, thereby making not only the first loss material layer 5 but also the second loss material layer 3 thin.

The first and second loss material layers 3 and 5 are loss materials that cause energy loss to electromagnetic waves. Both of the layers may be loss materials having the dielectric property (hereinafter, may be referred to as "dielectric loss materials") or may be magnetic loss materials. Alternatively, one of the layers may be a loss material having the dielectric property and the other may be a magnetic loss material. In this embodiment, the first loss material layer 5 is a magnetic loss material and the second loss material layer 3 is a loss material having the dielectric property.

In another embodiment of the invention, a configuration may be applied in which an electromagnetic wave absorber does not include the electromagnetic wave reflecting plate 2 in the embodiment shown in FIG. 1, and this electromagnetic wave absorber not including the electromagnetic wave reflecting plate 2 is disposed such that a surface portion of the second loss material layer 3 on the side (lower side in FIG. 1) opposite to the side (upper side in FIG. 1) from which electromagnetic waves income is disposed on a face of a material having the property of blocking electromagnetic waves. The material having the property of blocking electromagnetic waves may have a similar configuration to that of, for example, the conductive reflecting plate 2, or may be realized as a metal plate and the like. This embodiment achieves a similar effect to that of the configuration in which the conductive reflecting plate 2 is provided.

Figure 2:
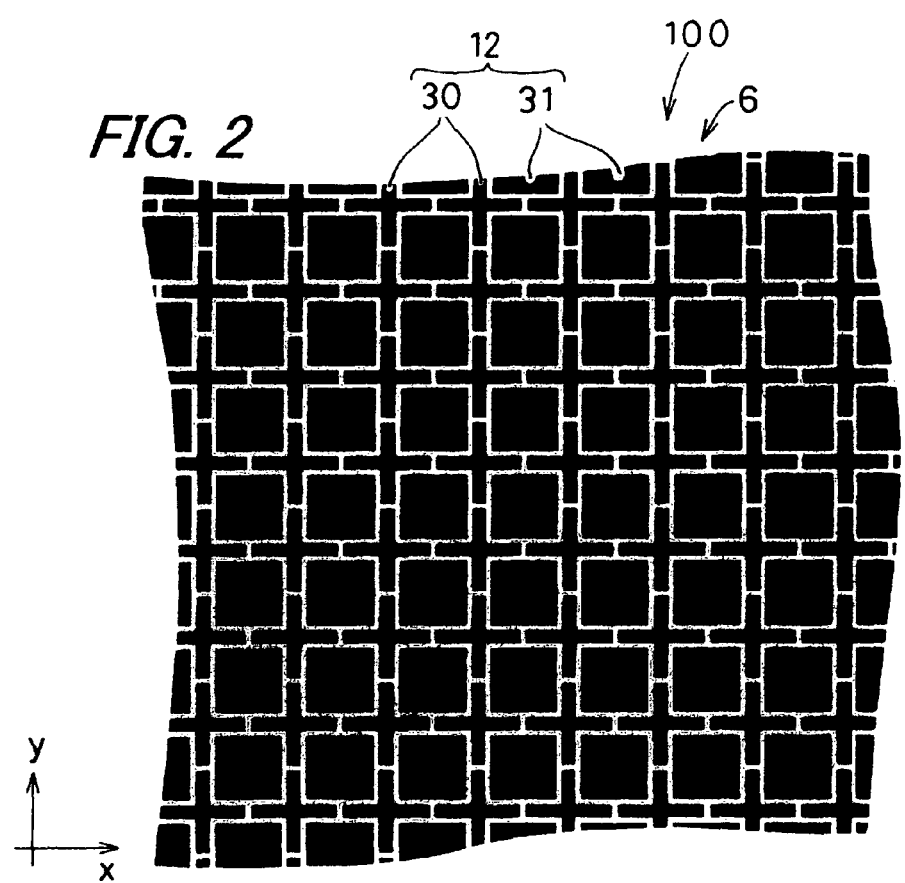
FIG. 2 is a perspective view showing a first conductor element layer 6 constituting the electromagnetic wave absorber 1.
Figure 3:
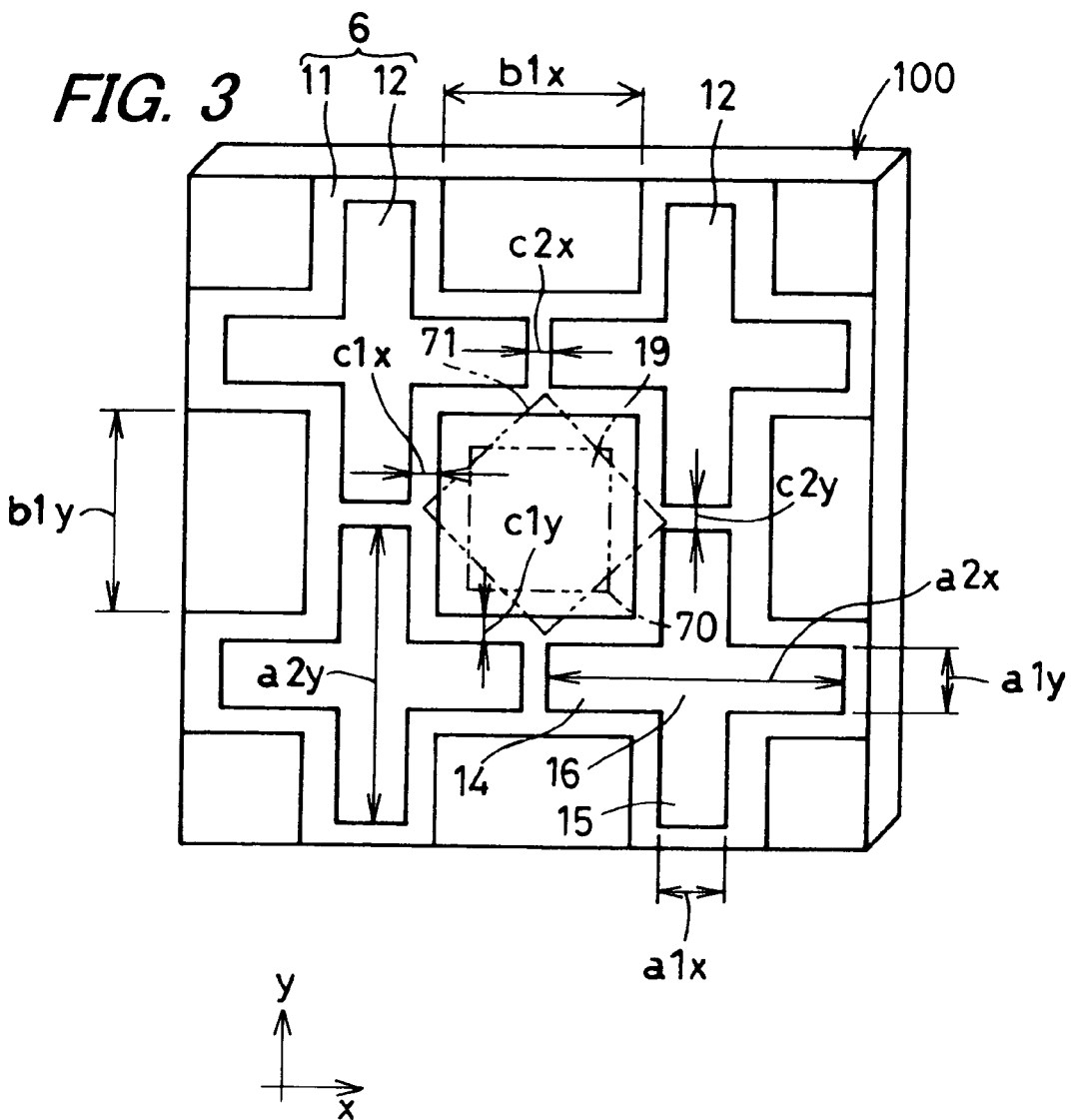
FIG. 3 is a perspective view showing an enlarged portion of the first conductor element layer 6.

FIG. 2 is a front view showing the first conductor element layer 6 constituting the electromagnetic wave absorber 1 that is an embodiment of the invention shown in FIG. 1. FIG. 3 is a perspective view showing an enlarged portion of the first conductor element layer 6 in the embodiment shown in FIGS. 1 and 2. In the first conductor element layer 6, the first conductor element group 12 made of metal is formed on a surface of a plate-shaped base material 11 on the side from which electromagnetic waves income. The plate-shaped base material 11 is constituted by a dielectric that is a synthetic resin, for example, and this plate-shaped base material 11 also is a loss material having the dielectric property. The first conductor element group 12 has the cross conductor element (hereinafter, may be referred to as a "cross element") 30 and the quadrangular conductor element (hereinafter, may be referred to as a "quadrangular element") 31.

The cross element 30 is formed in the shape of a cross, and a plurality of cross elements 30 are provided with spacings (hereinafter, referred to as "cross element spacings") $c2x$ and $c2y$ interposed therebetween. More specifically, the cross elements 30 are arranged such that radially extending portions 32 are faced with each other, and that the cross element spacings $c2x$ and $c2y$ are interposed between the radially extending portions 32 that are faced with each other. More specifically, in this embodiment, for example, the cross elements 30 may be formed in the shape of crosses radially extending in the x-direction and the y-direction that are perpendicular to each other and may be regularly arranged in a matrix with the cross element spacing $c2x$ interposed in the x-direction and the cross element spacing $c2y$ interposed in the y-direction.

The cross element 30 has a shape in which a rectangular-shaped portion 14 that is long in the x-direction and a rectangular-shaped portion 15 that is long in the y-direction are overlapped at the centroids of the shaped portions 14 and 15 and intersect each other at right angles at an intersection portion 16. The shaped portions 14 and 15 are displaced from each other by 90 degrees around a perpendicular axis at the intersection portion 16, and have the same shape. Widths $a1y$ and $a1x$ of the shaped portions 14 and 15 are equivalent to each other, and are 2.5 mm, for example. Lengths $a2x$ and $a2y$ of the shaped portions 14 and 15 are equivalent to each other, and are 16 mm, for example. Regarding the cross element spacings of the cross conductor elements 30, the spacing $c2x$ in the x-direction and the spacing $c2y$ in the y-direction are equivalent to each other, and are 1.0 mm, for example.

The quadrangular conductor element 31 is disposed in an area surrounded by the cross conductor elements 30 with spacings (hereinafter, referred to as "radial quadrangle spacings") $c1x$ and $c1y$ from the cross conductor elements 30, and disposed so as to fill in the area surrounded by the cross conductor elements 30. More specifically, the quadrangular conductor element 31 is formed in the shape corresponding to the area surrounded by the cross patterned portions. More specifically, in this embodiment, for example, the cross conductor element portion 30 is in the form of a cross as described above, an area surrounded by the cross conductor elements 30 is rectangular, and the shape corresponding thereto, that is, the shape in which the radial quadrangle spacings $c1x$ and $c1y$ are constant throughout the entire periphery is formed. When the shaped portions 14 and 15 are in the same shape as described above, the area surrounded by the cross conductor elements 30 is a square, and the quadrangular conductor element 31 is a square. The quadrangular conductor element 31 is disposed such that the rim portions thereof extend in the x-direction and the y-direction.

Regarding the quadrangular conductor element 31, a size b1x in the x-direction and a size b1y in the y-direction are equivalent to each other, and are 12.5 mm, for example. Regarding the radial quadrangle spacings between the cross conductor element 30 and the quadrangular conductor element 31, the spacing c1x in the x-direction and the spacing c1y in the y-direction are equivalent to each other, and are 1.0 mm, for example.

The cross element 30 is polygonal, and corner portions 80 of both end portions of the shaped portions 14 and 15, and corner portions 81 of the intersection portion 16 are formed to be sharp, that is, to be angled and edged. Furthermore, the quadrangular element 31 is polygonal, specifically, square, and corner portions 82 are formed to be sharp, that is, to be angled and edged. In this manner, all of the corner portions 80, 81, and 82 of the conductor elements 30 and 31 are formed to be angled and edged.

Figure 4:
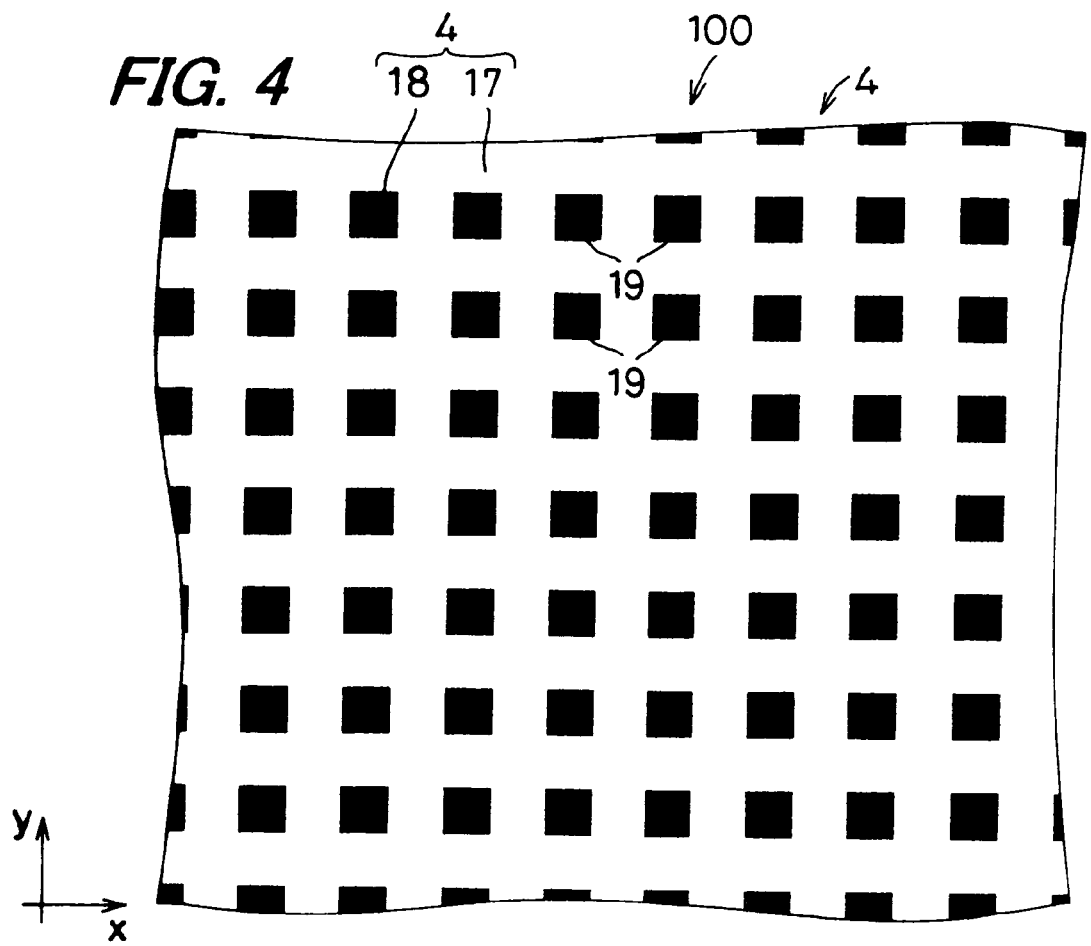
FIG. 4 is a front view of a second conductor element layer 4 constituting the electromagnetic wave absorber 1.
Figure 5:
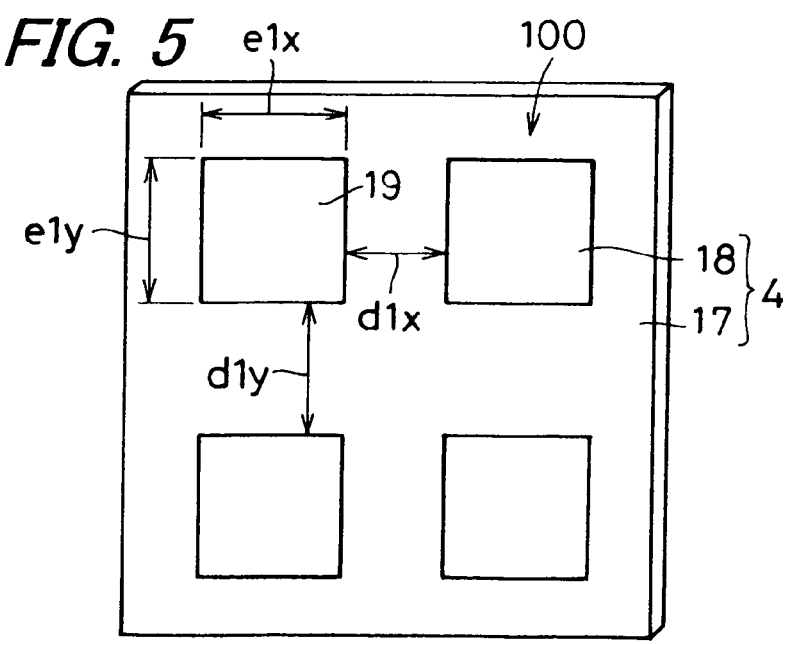
FIG. 5 is a perspective view showing an enlarged portion of the second conductor element layer 4.

FIG. 4 is a front view of the second conductor element layer 4 constituting the electromagnetic wave absorber 1 in the embodiment shown in FIGS. 1 to 3. FIG. 5 is a perspective view showing an enlarged portion of the second conductor element layer 4 shown in FIG. 4. The second conductor element layer 4 includes the second conductor element group 18 made of metal that is formed on a surface of a plate-shaped base material 17 on the side from which electromagnetic waves income. The plate-shaped base material 17 is constituted by a dielectric that is a synthetic resin, for example, and this plate-shaped base material 11 also is a loss material having the dielectric property. The second conductor element 18 is constituted by one type of the geometrical conductor elements (hereinafter, may be referred to as "intermediate conductor elements") 19 that are regularly arranged in a matrix with spacings (hereinafter, referred to as "second conductor element spacings") d1x and d1y interposed in the x-direction and the y-direction.

Each of the conductor element portions 19 made of metal is a square, and a length e1x in the x-direction and a length e1y in the y-direction are equivalent to each other, and are 8.0 mm, for example. Furthermore, regarding the second conductor element spacings that are spacings between the shapes 19 that are adjacent to each other in the x-direction and the y-direction, the spacing d1x in the x-direction and the spacing d1y in the y-direction are equivalent to each other, and are 9.0 mm, for example.

The arrangement intervals (pitches) in the x-direction and the y-direction of the conductor elements 30 and 31 in the first conductor element group 12 are equivalent to the arrangement intervals (pitches) in the x-direction and the y-direction of the conductor elements 19 in the second conductor element group 18. The first conductor element layer 6 and the second conductor element layer 4 are arranged such that the centroids of the quadrangular conductor elements 31 of the first conductor element group 12 and the centroids of the conductor elements 19 of the second conductor element group 18 are at the same positions in the x-direction and the y-direction as indicated by a phantom line 70 in FIG. 3.

The cross conductor elements 30 of the first conductor element group 12 are cross conductor elements, and the quadrangular conductor elements 31 of the first conductor element group 12 and the intermediate conductor elements 19 of the second conductor element group 18 are quadrangular conductor elements. In this manner, in the electromagnetic wave absorber 1, the plurality of conductor elements 19, 30, and 31 including the plurality of types of the conductor elements performing different receiving operations are arranged spaced away from each other, not only in the direction intersecting the incoming direction of electromagnetic waves, but also in the incoming direction of electromagnetic waves. The conductor elements 19, 30, and 31 constitute element receiving means 100. The loss materials 3, 5, 11, and 17 are provided close to the conductor elements 19, 30, and 31.

In this manner, in the electromagnetic wave absorber 1, the element receiving means 100 makes it possible to efficiently receive electromagnetic waves with the same frequency as the resonant frequencies of the conductor elements 19, 30, and 31. The loss materials 3, 5, 11, and 17 are provided close to this element receiving means 100, and cause energy loss to electromagnetic waves that are received by the element receiving means 100. In other words, the energy of electromagnetic waves can be converted into thermal energy and absorbed. By using the element receiving means 100 in this manner, it is possible to efficiently receive and absorb electromagnetic waves. Furthermore, not one type of conductor elements, but a plurality of types of conductor elements, that is, cross-shaped and quadrangular conductor elements in this embodiment are provided, and thus it is possible to efficiently receive and efficiently absorb electromagnetic waves taking advantage of the property of each element.

It is possible to improve the absorption efficiency of electromagnetic waves in this manner, and thus a high ability to absorb electromagnetic waves can be obtained, an absorber can be made thinner and lighter, and the degree of freedom in selecting materials for the loss materials is increased, so that it is possible to obtain the electromagnetic wave absorber that is flexible and excellent in the strength and workability. For example, in this embodiment, the electromagnetic wave absorber 1 is formed in the shape of a sheet in which the total thickness is 0.1 mm or more and 4 mm or less and the mass per unit area is 0.2 kg/m$^2$ or more and 5 kg/m$^2$ or less.

Figure 6:
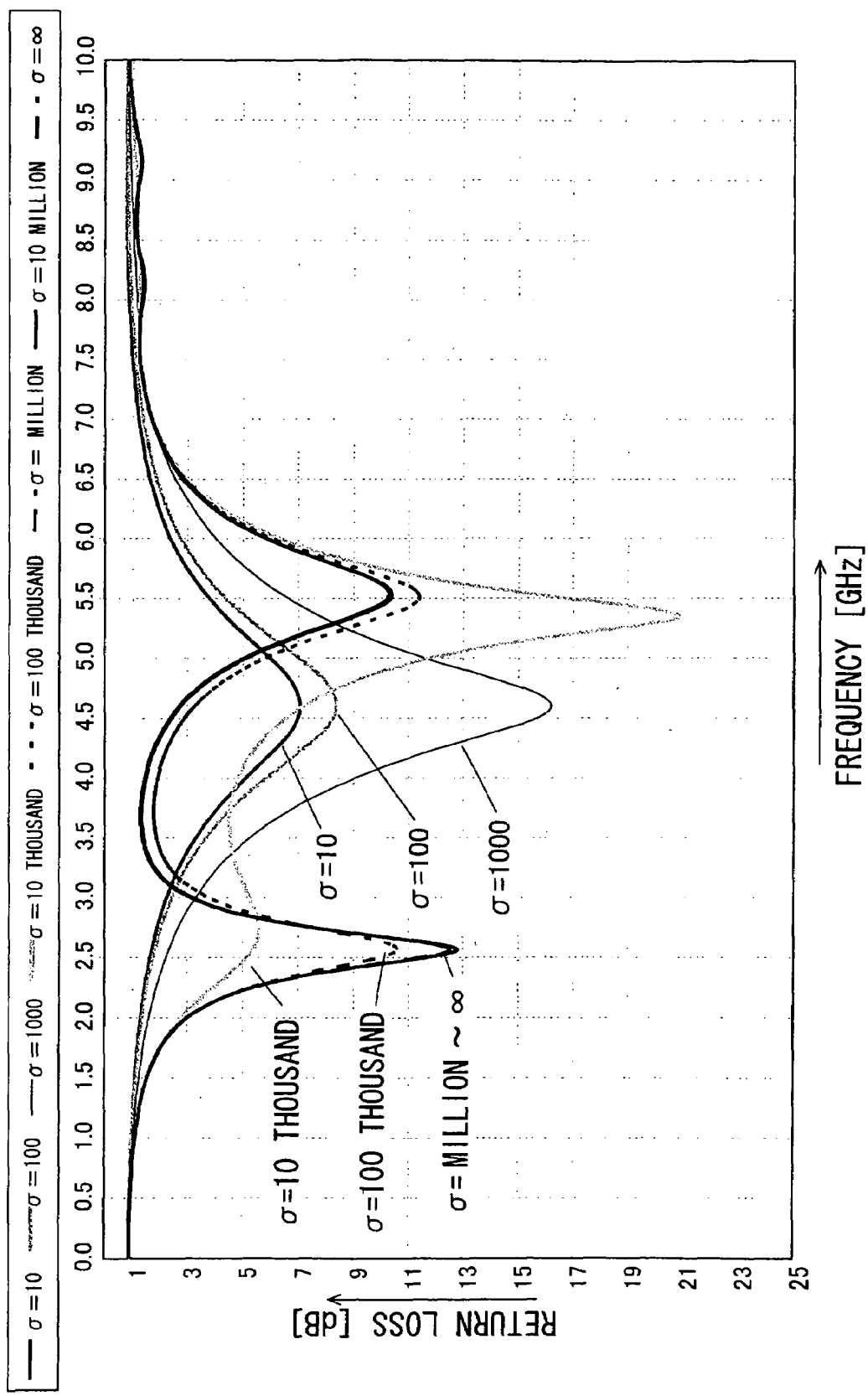
FIG. 6 is a graph showing the relationship (calculated values) between a difference in the conductivity and the ability to absorb electromagnetic waves of a conductor element.

FIG. 6 is a graph of the results (calculated values) of a simulation showing the relationship between a difference in the conductivity ($\sigma$) and the ability to absorb electromagnetic waves of a conductor element. When the conductivity of a conductor element is increased, in a first stage, an effect of increasing the dielectric constant of a surface layer rather than a function as a receiving element is obtained. At a particular frequency, the matching is attained and the absorption property is increased, but no effect is confirmed in lowering the absorption frequency. In this stage, the effect of making the absorber thinner is small. When the conductivity of the conductor element is increased, specifically, increased to 10,000 S/m or more, an effective function as a receiving element is obtained, and the frequency is lowered and a high absorption property is obtained. Generally, the absorption frequency tends to be shifted toward a lower frequency when the thickness of an electromagnetic wave absorber is increased, and the absorption frequency tends to be shifted toward a higher frequency when the thickness is reduced. More specifically, in order to make an absorber thin while fixing the absorption frequency, a factor other than the thickness is necessary, and it is preferable to use a material, such as the conductor elements of at least one embodiment of the invention, having an effect of lowering the frequency.

In the conductor elements 19 and 31, the outer peripheral length of the quadrangular receiving elements is optimized such that the receiving elements resonate with electromagnetic waves that are to be absorbed, and thus the sizes thereof described above are determined. Accordingly, the sizes are one example, and are determined, based on the frequency of electromagnetic waves that are to be absorbed, such that the frequency matches the resonant frequency. Furthermore, the spacings between the conductor elements 19, 30, and 31 are determined, based on the frequency of electromagnetic waves that are to be absorbed, such that the receiving efficiency is improved. Furthermore, the properties of the loss materials 3, 5, 11, and 17, specifically, the properties such as the complex relative dielectric constant, the complex relative permeability, and the thickness, which are based on the characteristics of the material, are determined, based on the frequency of electromagnetic waves that are to be absorbed, such that the receiving efficiency is improved. In this manner, the sizes of the conductor elements 19, 30, and 31 and the sizes of the spacings are determined, and the loss materials 3, 5, 11, and 17 are configured, and thus it is possible to efficiently receive electromagnetic waves.

At that time, all of the resonant frequencies of the conductor elements 19, 30, and 31 may be the same so that it is possible to receive electromagnetic waves with this frequency at an extremely high receiving efficiency. Alternatively, the resonant frequencies of the conductor elements 19, 30, and 31 may be different from each other so that it is possible to absorb a wide band of electromagnetic waves.

Furthermore, when the electromagnetic wave reflecting plate 2 is not provided, the electromagnetic wave absorber is disposed on a face of a material having the property of blocking electromagnetic waves. Accordingly, it is possible to easily determine, that is, design the shape, the size, and the like of the element receiving means 100. Furthermore, in the configuration in which the electromagnetic wave reflecting plate 2 is used, it is possible to prevent the resonant frequencies of the conductor elements 19, 30, and 31 from being changed by the influence of a location at which the electromagnetic wave absorber 1 is disposed. For example, even when the electromagnetic wave absorber 1 is provided in a building interior material, it is possible to prevent the resonant frequencies of the conductor elements from being changed by the influence of factors such as the complex relative dielectric constant of the interior material.

Furthermore, in the first conductor element group 12, the cross conductor elements 30 are arranged such that the radially extending portions are faced with each other as described above, and the quadrangular conductor elements 31 are formed in the shape corresponding to the area surrounded by the cross conductor elements 30. This arrangement provides an optimum (high) receiving efficiency in the combination of the cross conductor elements 30 and the quadrangular conductor elements 31. Accordingly, it is possible to realize the electromagnetic wave absorber with a high receiving efficiency. Furthermore, the cross conductor elements 30 are arranged so as to radially extend in the x-direction and the y-direction, and the quadrangular conductor elements 31 are arranged such that the rim portions thereof extend in the x-direction and the y-direction. Accordingly, it is possible to improve the receiving efficiency of electromagnetic waves that are polarized in the x-direction and the y-direction.

Figure 7:
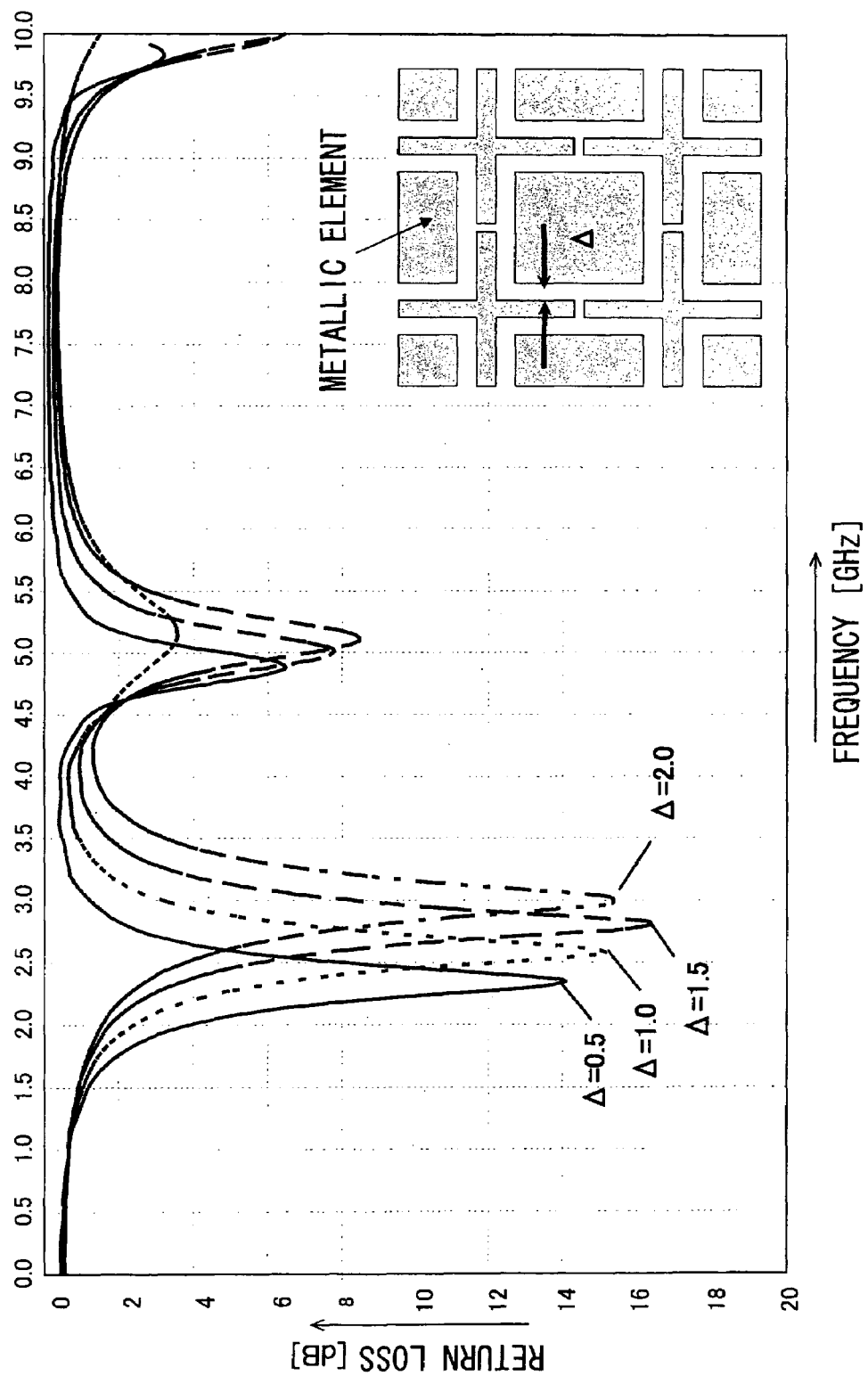
FIG. 7 is a graph showing the relationship (calculated values) between the positional relationship and the ability to absorb electromagnetic waves of two types of conductor elements.

FIG. 7 is a graph showing the relationship (calculated values) between the positional relationship and the ability to absorb electromagnetic waves of two types of conductor elements. In FIG. 7, the radial quadrangle spacings $c1x$ and $c1y$ are indicated by "Δ". As is clear in FIG. 7, an effect of the positional relationship and an effect of the shape of the two types of the conductor elements 30 and 31 according to at least one embodiment of the invention are confirmed as below. Regarding the positional relationship, in a state where $c1x=c1y$, when $c1x$ is 0.5, 1.0, 1.5, and 2.0, as the elements move closer to each other, the absorption is comparatively reduced, but the absorption peak is shifted toward a lower frequency. This selection of the radial quadrangle spacings $c1x$ and $c1y$ can be used as a method for controlling the position of the absorption peak. Accordingly, it is possible to lower the absorption frequency while keeping the thickness of the electromagnetic wave absorber 1 small, by selecting the radial quadrangle spacings $c1x$ and $c1y$.

Figure 8:
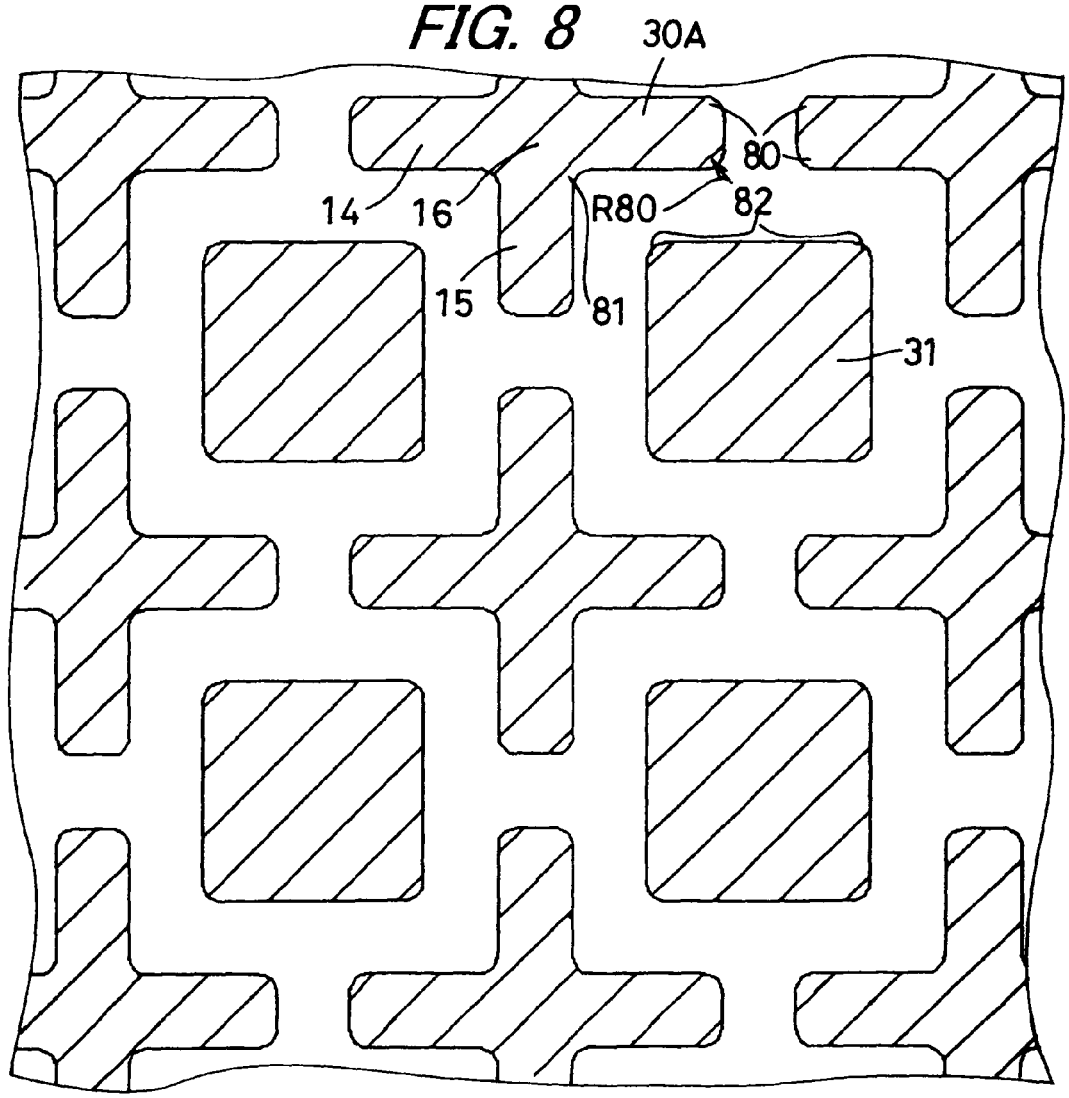
FIG. 8 is a front view showing conductor elements 30 and 31 in another embodiment.

FIG. 8 is a front view showing the conductor elements 30 and 31 of the first conductor element layer in another embodiment of the invention. This embodiment and the embodiment shown in FIGS. 1 to 7 are similar to each other and have the same configuration, except that the shapes of the conductor elements 30 and 31 of the first conductor element layer are different, and thus the same symbols are used. In FIGS. 1 to 7, the conductor elements 30 and 31 are polygonal, and the corner portions are formed to be sharp. However, the cross conductor element 30 and the quadrangular conductor element 31 in this embodiment are substantially polygonal, and at least one, specifically, all of the corner portions 80, 81, and 82 are formed in the shape of arcs with a curvature radius corresponding to the frequency of electromagnetic waves that are to be absorbed. This shape is also possible, and provides a similar effect as in the configuration in FIGS. 1 to 7.

Figure 9:
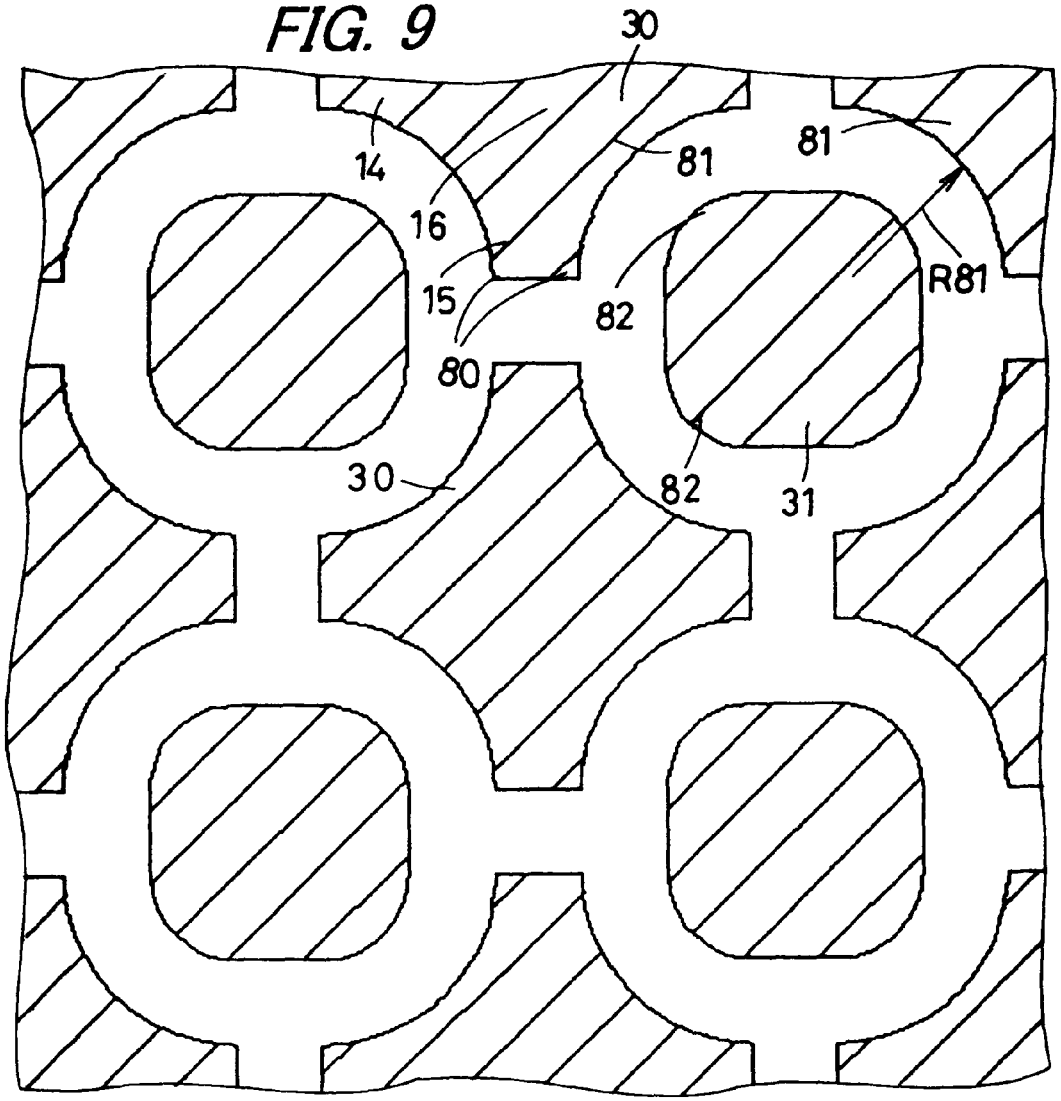
FIG. 9 is a front view showing the conductor elements 30 and 31 in another embodiment of the invention.

FIG. 9 is a front view showing the conductor elements 30 and 31 in another embodiment of the invention. This embodiment and the embodiment shown in FIGS. 1 to 7 are similar to each other and have the same configuration, except that the shapes of the conductor elements 30 and 31 of the first conductor element layer are different, and thus the same symbols are used. The cross element 30 and the quadrangular element 31 in this embodiment are substantially polygonal, and at least one corner portion is formed in the shape of an arc with a curvature radius corresponding to the frequency of electromagnetic waves that are to be absorbed.

More specifically, all of the corner portions 82 of the quadrangular element 31 are formed in the shape of arcs, and the corner portions 81 at the intersection portion between the shaped portions 14 and 15 of the cross element 30 are formed in the shape of arcs. A curvature radius R81 of the corner portions of the intersection portion 16 is the same as the amount of the shaped portions 14 and 15 projecting from the intersection portion 16. The corner portions 80 of both end portions of the shaped portions 14 and 15 are formed to be sharp. More specifically, the cross element 30 is edged. This shape is also possible, and provides a similar effect as in the configuration in FIGS. 1 to 7.

Figure 10:
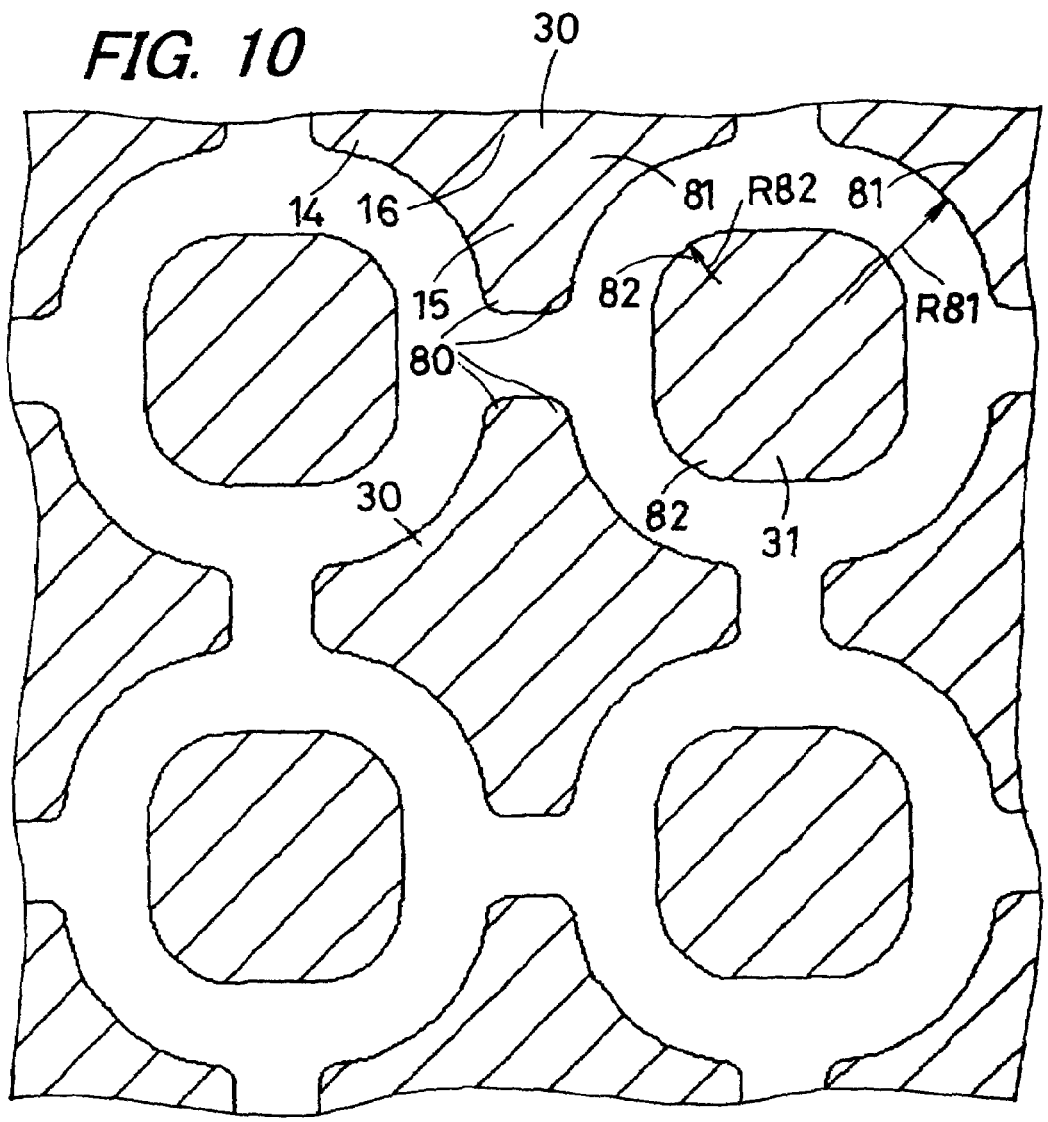
FIG. 10 is a front view showing the conductor elements 30 and 31 in another embodiment of the invention.

FIG. 10 is a front view showing the conductor elements 30 and 31 in another embodiment of the invention. This embodiment and the embodiment shown in FIGS. 1 to 7 are similar to each other and have the same configuration, except that the shapes of the conductor elements 30 and 31 of the first conductor element layer are different, and thus the same symbols are used. The cross element 30 and the quadrangular element 31 in this embodiment are in the shape similar to that shown in FIG. 10. In the configuration in FIG. 10, the corner portions 80 of both end portions of the shaped portions 14 and 15 of the cross element 30 are formed to be sharp, but in this embodiment, the corner portions are formed in the shape of arcs. Other configurations are the same. This shape is also possible, and provides a similar effect as in the configuration in FIGS. 1 to 7.

Figure 11:
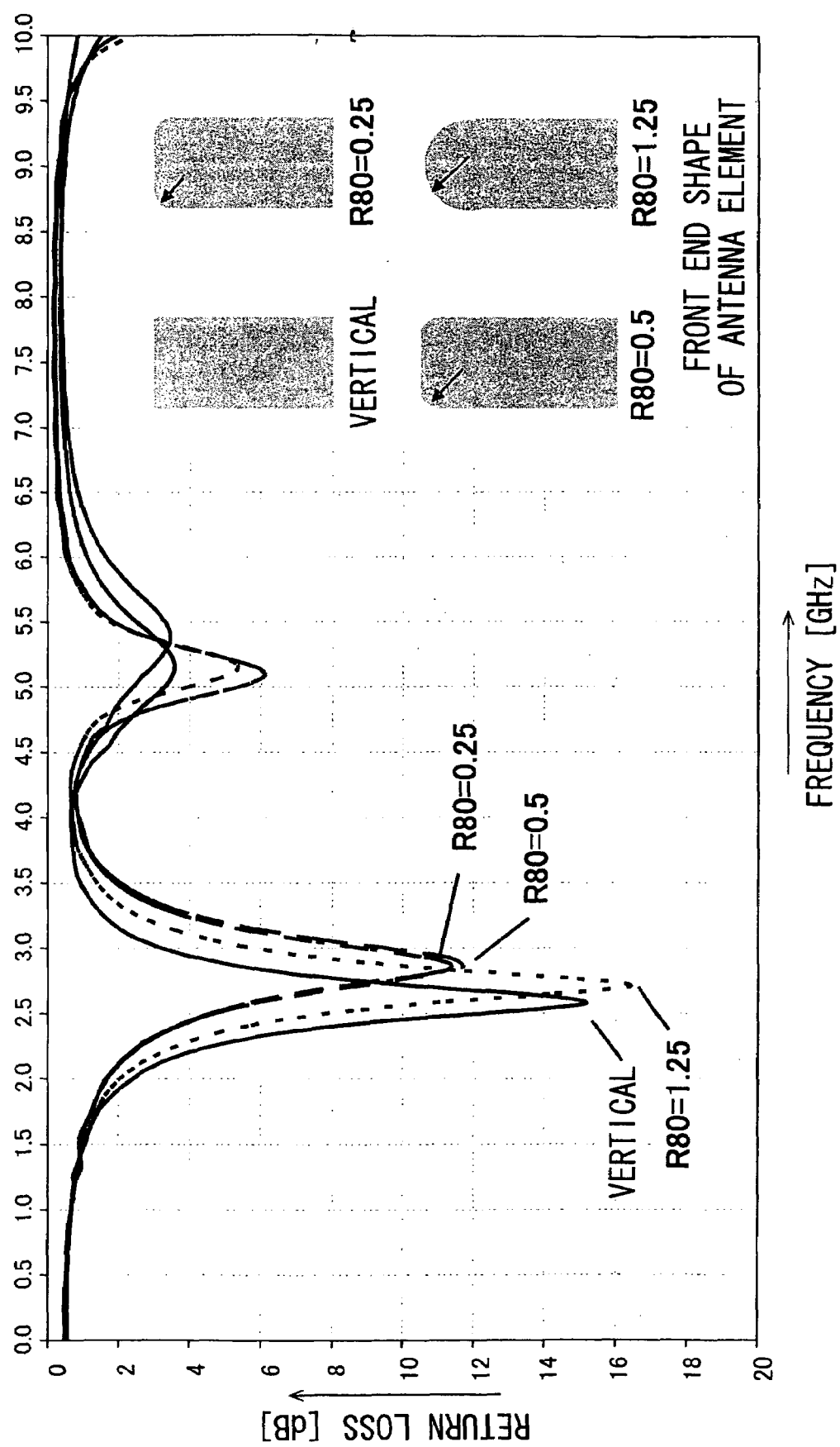
FIG. 11 is a graph showing the relationship (calculated values) between the shape and the ability to absorb electromagnetic waves of a conductor element.

FIG. 11 is a graph showing the relationship (calculated values) between the shape and the ability to absorb electromagnetic waves of a conductor element. FIG. 11 shows the property of absorbing electromagnetic waves in a case where only the corner portions 80 of both end portions of the shaped portions 14 and 15 of the cross element 30 are formed in the shape of arcs, and have different curvature radiuses R. As shown in FIG. 11, the effect of the shape of this conductor element is better when the curvature radius R of the corner portion 80 is 1.25 than when the shape is not provided with R (FIGS. 1 to 7). It has been predicted that when the curvature is provided, the Q value is lowered and the absorption is reduced, but the opposite results are obtained. The reason for this is that resonating current paths become smooth, and thus the current continuously flows. It is possible to improve the absorption efficiency of electromagnetic waves by determining the corner portions of the conductor elements 30 and 31 in this manner based on the frequency of electromagnetic waves that are to be absorbed, in other words, the overall shape and size of the conductor elements 30 and 31. Furthermore, as is clear in FIG. 9, the frequency of electromagnetic waves that are absorbed, that is, the absorption peak is changed depending on the curvature radius of the corner portion. Thus, it is possible to adjust the frequency that is absorbed, by selecting the curvature radius of the corner portion.

Figure 12:
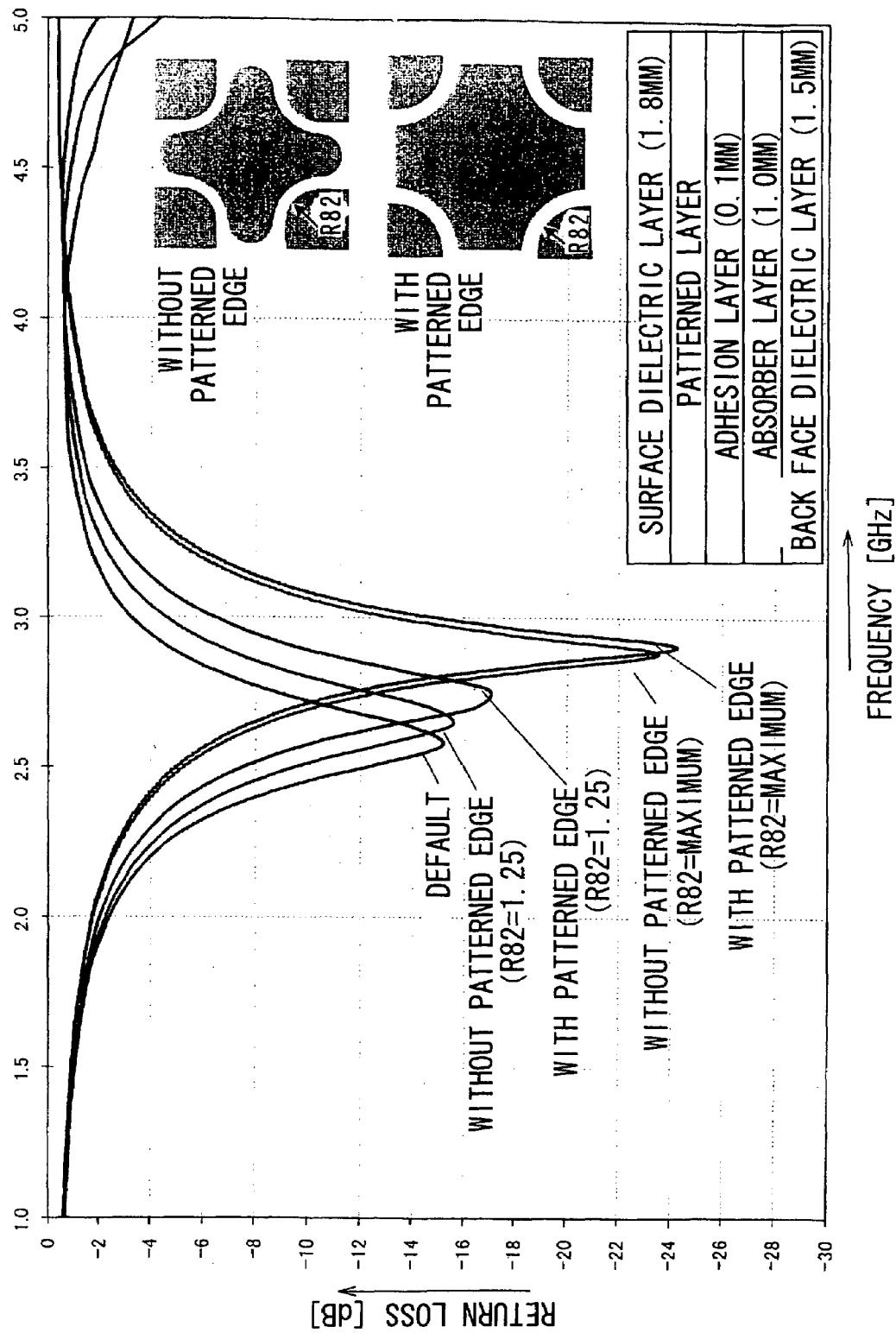
FIG. 12 is a graph showing the relationship (calculated values) between the curvature radius of a corner portion and the ability to absorb electromagnetic waves of a conductor element.

FIG. 12 is a graph showing the relationship (calculated values) between the curvature radius of a corner portion and the ability to absorb electromagnetic waves of a conductor element. "Default" indicates the case of the conductor elements 30 and 31 shown in FIGS. 1 to 7 in which all of the corner portions 80 to 82 are formed to be sharp, that is, to be edged. "Without patterned edge" indicates a case in which all of the corner portions 80 to 82 are formed in the shape of arcs. "With patterned edge" indicates a case in which the corner portions 80 of both end portions of the shaped portions 14 and 15 of the cross conductor element 30 are edged and the other corner portions 81 and 82 are formed in the shape of arcs. Furthermore, cases in which a curvature radius R82 of the corner portions 82 is 1.25 mm and cases in which the curvature radius R82 of the corner portions 82 is maximum are shown. The curvature radius R82 of the corner portions 82 in the quadrangular conductor element 31 is determined depending on the curvature radius R81 of the corner portions 81 at the intersection portion 16 in the cross conductor element 30 such that spacings from the cross conductor elements 30 are constant (equivalent to each other). The maximum value of the curvature radius R81 of the corner portions 81 at the intersection portion 16 in the cross conductor element 30 is the amount of the shaped portions 14 and 15 projecting from the intersection portion 16. The value of the curvature radius R82 of the corner portions 82 in the quadrangular conductor element 31 in this case is the maximum value of the curvature radius R82 of the corner portions 82. As is clear also in FIG. 12, it is shown that the absorption efficiency of electromagnetic waves is higher when the corner portions 80 to 82 are formed in the shape of arcs than when all of the corner portions 80 to 82 are edged as in the results in FIG. 11.

Figure 13:
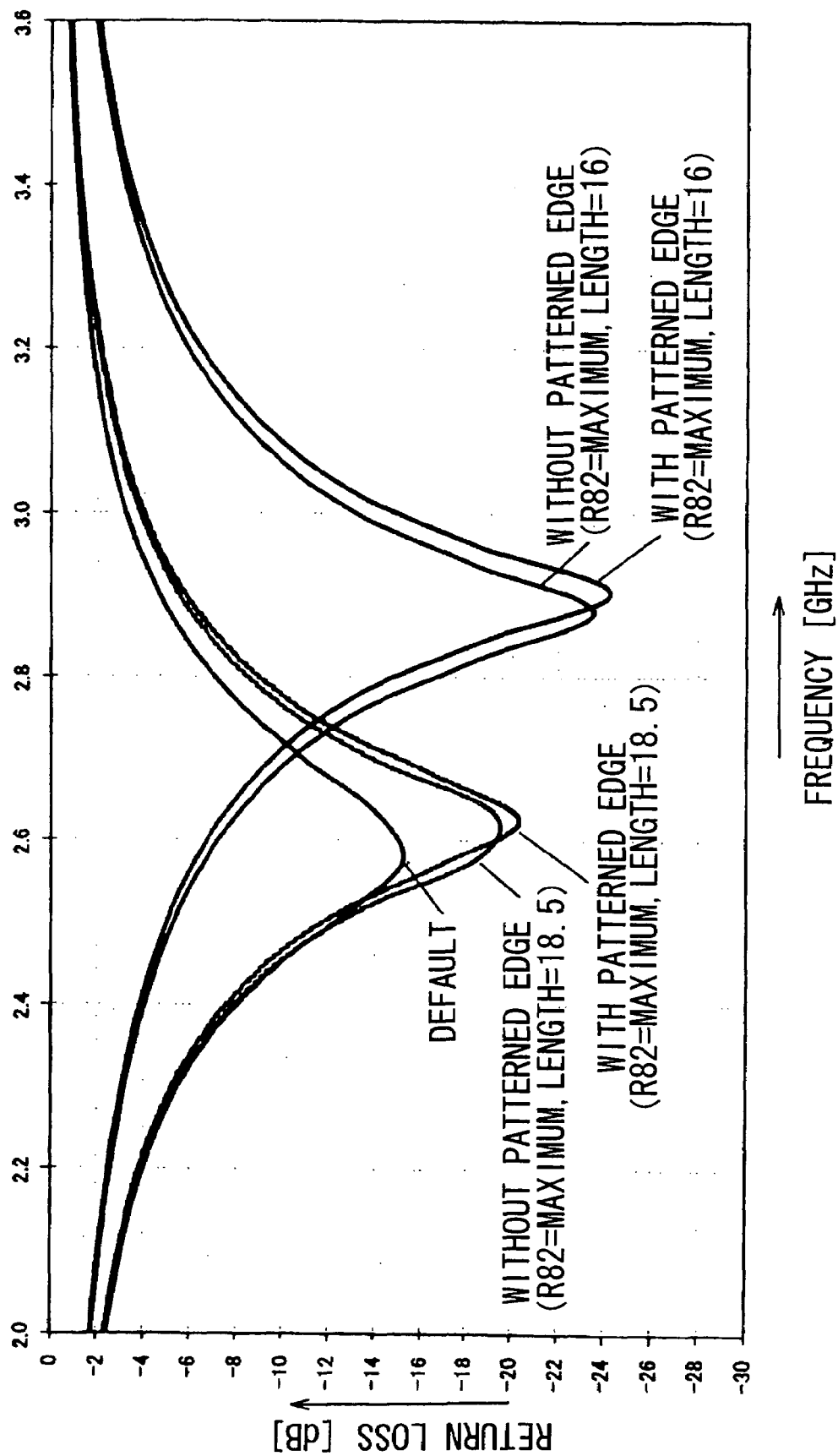
FIG. 13 is a graph showing the relationship (calculated values) between a length a2x, a2y of a shaped portion 14, 15 and the ability to absorb electromagnetic waves of a cross conductor element 30.

FIG. 13 is a graph showing the relationship (calculated values) between the length a2x, a2y of the shaped portion 14, 15 and the ability to absorb electromagnetic waves of the cross conductor element 30. "Default", "Without patterned edge", and "With patterned edge" have the same meaning as that in FIG. 12. "Length" refers to the length a2x, a2y of the shaped portion 14, 15, and is expressed in the unit of mm. As is clear in FIG. 13, it is shown that when the corner portions 82 of the quadrangular conductor element 31 are formed in the shape of arcs, the absorption peak is shifted toward a higher frequency, but the absorption efficiency can be improved. Furthermore, it is shown that as the length a2x, a2y of the shaped portion 14, 15 becomes longer, the absorption peak is shifted toward a lower frequency. Moreover, it is shown that the absorption efficiency can be made higher when the corner portions 82 of the quadrangular conductor element 31 are formed in the shape of arcs and the frequency is lowered by increasing the lengths a2x and a2y of the shaped portions 14 and 15 so as to correct the amount of the absorption peak shifted herein toward a higher frequency, than when the corner portions 82 of the quadrangular conductor element 31 are edged.

Figure 14:
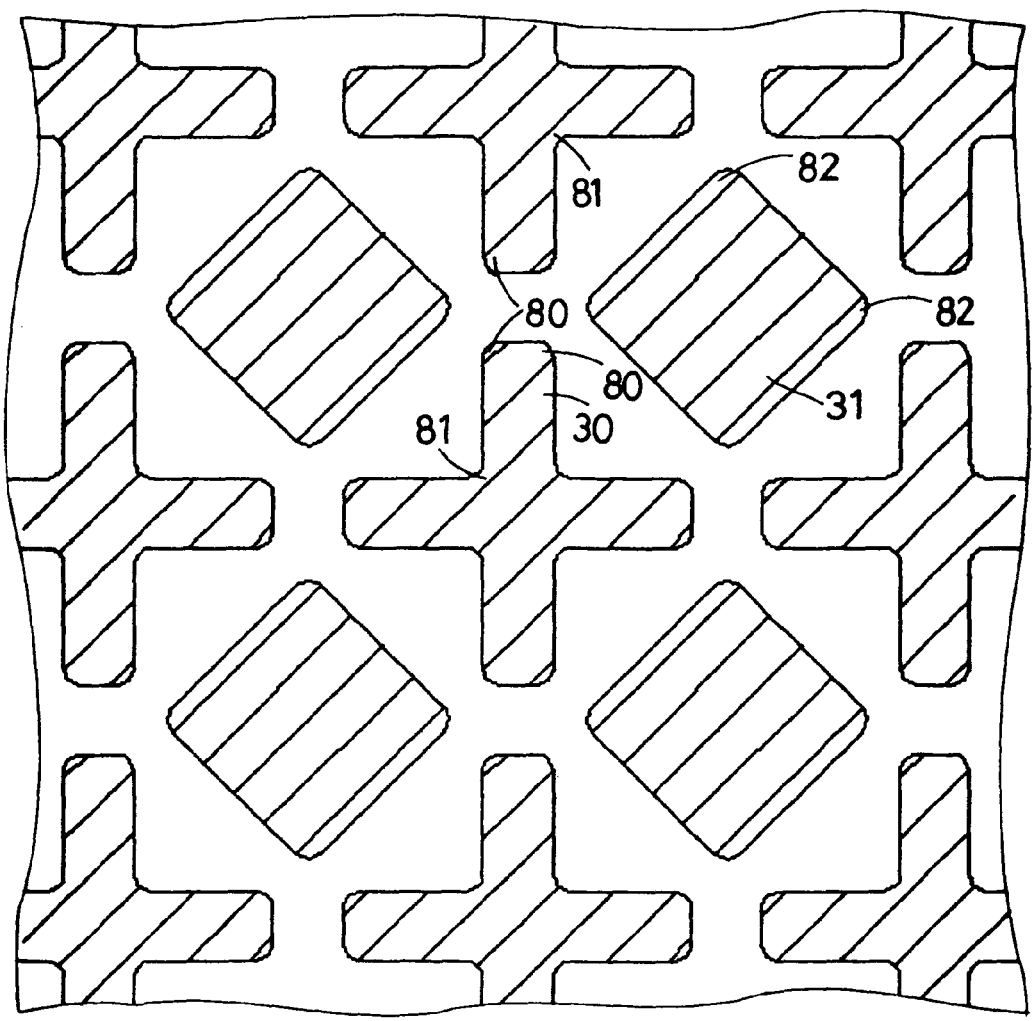
FIG. 14 is a front view showing the conductor elements 30 and 31 in another embodiment of the invention.

FIG. 14 is a front view showing the conductor elements 30 and 31 in another embodiment of the invention. As another embodiment of the invention, for example, at least one of the quadrangular conductor element 31 and the intermediate conductor element 19 is angularly displaced with respect to the cross conductor element 30 such that the rim portions thereof extend in directions that are perpendicular to the x-direction and the y-direction. For example, in a configuration shown in FIG. 8 in which the corner portions 80 to 82 are formed in the shape of arcs, the quadrangular conductor element 31 may be disposed such that the rim portions thereof are inclined by 45 degrees with respect to the x-direction and the y-direction as shown in FIG. 14. Furthermore, in a configuration in which the corner portions 80 to 82 are edged, the quadrangular conductor element 31 may be disposed such that the rim portions thereof are inclined by 45 degrees with respect to the x-direction and the y-direction as indicated by a phantom line 71 in FIG. 3. In either case, it is possible to prevent the difference in the receiving efficiency from being caused by the direction of the polarization, by angularly displacing the quadrangular conductor element 31.

Furthermore, in another embodiment of the invention, the flame resistance, the quasi-incombustibility, or the incombustibility is provided in the electromagnetic wave absorber by adding a flame retardant or a flame retardant assistant to the loss material layer 3, 5, for example. This electromagnetic wave absorber can be used preferably as a building interior material.

There is no specific limitation regarding the flame retardant, and it is possible to use an appropriate amount of phosphorus compound, boron compound, bromine-based flame retardant, zinc-based flame retardant, nitrogen-based flame retardant, and hydroxide-based flame retardant, for example. Examples of the phosphorus compound include phosphate ester and titanium phosphate. Examples of the boron compound include zinc borate. Examples of the bromine-based flame retardant include hexabromobenzene, decabromobenzyl phenyl ether, decabromobenzyl phenyl oxide, tetrabromobisphenol, and ammonium bromide. Examples of the zinc-based flame retardant include zinc carbonate, zinc oxide, and zinc borate. Examples of the nitrogen-based flame retardant include a triazine compound, a hindered amine compound, and melamine-based compounds such as melamine cyanurate and a melamine guanidine compound. Examples of the hydroxide-based flame retardant include magnesium hydroxide and aluminium hydroxide.

Among the constituents of at least one embodiment of the invention, as the first loss layer 5, it is possible to use dielectric materials such as a polymer, a lumber, and a plaster material, that have the complex relative dielectric constant. When the real part of the relative dielectric constant is increased, the imaginary part of the relative dielectric constant is also increased, and thus the dielectric loss property is increased. As the dielectric loss material that is filled in a material such as a polymer in order to increase the complex relative dielectric constant, it is possible to use carbon black such as furnace black and channel black; conductive particles of stainless steel, copper, and aluminum, for example; graphite; carbonfiber; titanium oxide; barium titanate; and potassium titanate, for example. The dielectric loss material that is preferably used in at least one embodiment of the invention is carbon black, and in particular, carbon black with a specific surface area by nitrogen adsorption (ASTM (American Society for Testing and Materials) D3037-93) of 100 to 1000 m²/g and a DBP oil absorption (ASTM D2414-96) of 100 to 500 cm³/100 g is preferable.

The DBP oil absorption refers to the absorption (unit: cm³/100 g) of DBP (abbreviation for dibutyl phthalate), which is one type of plasticizers. For example, IP1000 (product name, produced by SHOWA CABOT K.K.) and Ketjenblack EC (product name, produced by LION AKZO CO., LTD.) are used. When the specific surface area by nitrogen adsorption is 100 m²/g or less, it is impossible to attain a sufficient complex relative dielectric constant. When the specific surface area by nitrogen adsorption is 1000 m²/g or more, the dispersibility of dielectric loss materials is significantly poor. When the DBP oil absorption is 100 cm³/100 g or less, it is impossible to attain a sufficient complex relative dielectric constant. When the DBP oil absorption is 500 cm³/100 g or more, the processability is significantly poor.

When the imaginary part of the relative dielectric constant is increased, the conductivity comes to be exerted, and as a result, the ability to absorb electromagnetic waves is significantly impaired. There is a limitation in improving the dielectric loss effect, and thus optimization is performed in the relationship with the complex relative permeability.

A magnetic loss material may be used alone or in combination with a dielectric loss material for the first loss material layer 5. In order to provide the magnetic loss property (to increase the imaginary part of the relative permeability), a material such as a polymer, a plaster, and cement may be filled with a magnetic loss material. Examples of the magnetic loss material that is filled include particles of ferromagnetic materials such as ferrite, an iron alloy, pure iron, and iron oxide. The ferrite that is preferably used in at least one embodiment of the invention is Mn—Zn ferrite (specific gravity=5), which is a soft ferrite-based material in which the cost is low and the complex relative permeability is high. The average particle size of the ferrite is preferably 0.1 to 100 μm, and more preferably 1 to 10 μm. When the average particle size is less than 0.1 μm, the dispersibility is poor. When the average particle size is more than 100 μm, the processability is poor.

In at least one embodiment of the invention, the magnetic loss material described above was used, but there is no limitation to this, and magnetic loss materials of other types or shapes may be used, or may be used in combination with the magnetic loss material described above.

The condition for providing the complex relative permeability in the first loss material layer 5 that is also called an electromagnetic wave absorbing layer of at least one embodiment of the invention is to use the magnetic loss material. However, the magnetic loss material is heavy, and when a large amount of magnetic loss material is mixed, the weight of the electromagnetic wave absorber is significantly increased. Thus, a configuration may be applied in which the amount of the magnetic loss material added is made minimum and an appropriate amount of dielectric loss material is used in combination therewith. More specifically, in at least one embodiment of the invention, carbon black and Mn—Zn ferrite, and graphite and Mn—Zn ferrite are used in combination with each other.

As the polymer material (vehicle) that is used for the first loss material layer 5, a synthetic resin, a rubber, and a thermoplastic elastomer are used. Examples thereof include polyolefine such as polyethylene, polypropylene, copolymers thereof, polybutadiene, and copolymers thereof; thermoplastic resins or thermosetting resins such as polyvinyl chloride, polyvinyl acetate, an epoxy resin, and an ethylene-vinyl acetate copolymer; bitumen; and an electron beam or UV crosslinking polymer.

As the rubber, other than natural rubbers, various synthetic rubbers such as a styrene-butadiene rubber, an isoprene rubber, a butadiene rubber, an ethylene-propylene rubber, a chloroprene rubber, a nitrile rubber, an acrylic rubber, a chlorinated polyethylene rubber, a hydrogenated nitrile rubber, and a silicon rubber may be used alone or after being modified in various modification processes.

As the thermoplastic elastomer, it is possible to use various types of thermoplastic elastomers such as chlorinated polyethylene, and polystyrene-based, polyolefine-based, polyvinyl chloride-based, polyurethane-based, polyester-based, and polyamide-based elastomers.

These polymers may be used alone or in combination of a plurality of types. The resins and the thermoplastic elastomer materials may be used as resin compositions in which if necessary, a plasticizer, and a stabilizing agent, a filler for reinforcing, a fluidity improving agent, a flame retardant, and the like are added as appropriate. Other than a vulcanizing agent, it is possible to mix a vulcanization accelerator, an antioxidant, a softening agent, a plasticizer, a filler, a coloring agent, a flame retardant, and the like with the rubber material.

The first loss material layer 5 may be made of a material such as a plaster material and a cement material other than the polymers, and it is also possible to select as appropriate a material with which a filler can be mixed.

The amounts of the magnetic loss material and the dielectric loss material mixed with the polymer material may be determined such that in a configuration in which the conductor element layer is provided, a high absorbing ability (high receiving efficiency) can be obtained at a desired specific frequency band. More specifically, when the amounts of the magnetic loss material and the dielectric loss material mixed are smaller than appropriate amounts, both the real part and the imaginary part of the complex relative dielectric constant and the complex relative permeability of the material are so low that the matching on the frequency of target electromagnetic waves cannot be attained even with the conductor element layers 6 and 4 made of metal. On the contrary, when the amounts of the magnetic loss material and the dielectric loss material mixed are larger than appropriate amounts, both the real part and the imaginary part of the complex relative dielectric constant and the complex relative permeability of the material are so high that the matching on the frequency of target electromagnetic waves cannot be attained. When the electromagnetic wave absorber 1 that can absorb electromagnetic waves over a wide band is realized by adjusting the amounts mixed, it is possible to avoid the problem that the precision of the thickness is required to be high, and thus it is possible to produce the electromagnetic wave absorber 1 more easily.

A similar loss material to that for the first loss material layer 5 may be used also for the second loss material layer 3, and these loss materials may be the same or different. It is possible to use as usage, a dielectric material that is not conductive, such as paper and glass fabrics including a vinyl chloride resin, a melamine resin, a polyester resin, a urethane resin, a lumber, a plaster, cement, ceramics, a non-woven fabric, a resin foam, a heat insulating material, or flame-resistant paper. It would be appreciated that the dielectric loss material and the magnetic loss material may be mixed as appropriate.

The electromagnetic wave reflecting plate 2 may be metal such as gold, platinum, silver, nickel, chromium, aluminum, copper, zinc, lead, tungsten, and iron; a resin mixture obtained by mixing powders of the metals or conductive carbon black with a resin; or a film of a conductive resin, for example. It is also possible to use a material obtained by processing the metals into a plate, a sheet, a film, a non-woven fabric, or a cloth, for example. A form may be also applied in which a metal foil and a glass fabric are combined. Furthermore, a configuration may be applied in which a metal layer with a film thickness of, for example, 600 Å is formed on a synthetic resin film. Moreover, a configuration may be applied in which conductive ink (conductivity: 10,000 S/m or more) is applied to a substrate.

It is possible to form the first and second conductor elements made of metal of the conductor element layer 6 and the conductor element layer 4 using the above-described constituents of the electromagnetic wave reflecting plate 2. The first and second conductor elements made of metal may be formed on a film by a method such as evaporation of aluminum, etching, screen printing, gravure printing, and inkjet. However, there is no limitation to these, and each element pattern of the first and second conductor element groups may be directly evaporated, printed or applied to the electromagnetic wave absorbing layer 5 or the dielectric layer 3 without a film serving as a base material.

Hereinafter, the results of experiments performed by the present inventor are described.

Example 1

The electromagnetic wave reflecting plate 2 is an aluminum-evaporated polyethylene terephthalate (PET) film, for example. As the second loss material layer 3, a polyethylene resin foam is used, in which the complex relative dielectric constant (real part) ∈ is 1.25 (2.4 GHz) and the thickness is 1.5 mm. As the first loss material layer 5, 100 parts by weight of chloroprene rubber, 8 parts by weight of Ketjenblack EC (product name, produced by LION AKZO CO., LTD.) as a dielectric loss material, and 100 parts by weight of powder of ferrite (product name: KNS-415, produced by TODA KOGYO CORP.) as a magnetic loss material are kneaded, and then vulcanized and molded into a sheet (thickness: 1 mm).

At that time, the complex relative dielectric constant and the complex relative permeability of the vulcanized rubber sheet were measured by a coaxial cylinder method (S-parameter method). Considering the results thereof and lamination conditions of the electromagnetic wave absorber 1, an optimum value condition for attaining the matching was obtained by an electromagnetic analysis. Based on the results of this calculation, the sizes of the conductor elements 12 and 18 made of metal of the first conductor element layer 6 and the second conductor element layer 4 were determined, and the conductor element layers 6 and 4 were fabricated.

The first conductor element layer 6 was constituted by the base material 11 made of a polyethylene terephthalate (PET) film with a film thickness of 12 µm, and aluminum with a thickness of 600 Å formed thereon. Regarding the sizes of the elements 30 and 31 of the first conductor element group 12, the widths $a1y$ and $a1x$ of the shaped portions 14 and 15 are 2.5 mm, and the cross element spacings $c2x$ and $c2y$ are 1 mm. Thus, the first conductor element group 12 is formed with a spacing in which 1 mm is added to the length $b2x$, $b2y$ of the shaped portion 14, 15. The sizes (sizes of one side) $b1x$ and $b1y$ in the x-direction and the y-direction of the quadrangular conductor element 31 are 12.5 mm. The radial quadrangle spacings $c1x$ and $c1y$ are 1 mm.

The first conductor element layer 6 was constituted by the base material 17 made of a polyethylene terephthalate (PET) film with a film thickness of 12 µm, and aluminum with a thickness of 600 Å formed thereon. Regarding the second conductor element group 18, the sizes (sizes of one side) $e1x$ and $e1y$ in the x-direction and the y-direction of the conductor elements 19 are half the lengths $a2x$ and $a2y$ of the shaped portions 14 and 15. The second conductor element group 18 is formed with a spacing in which 1 mm is added to the length $b2x$, $b2y$ of the shaped portion 14, 15. During the lamination, the first conductor element group 12 and the second conductor element group 18 are laminated in the above-described arrangement.

Furthermore, the electromagnetic wave absorber 1 was configured by laminating the first conductor element layer 6, the first loss material layer 5, the second conductor element layer 4, the second loss material layer 3 (PET), and the electromagnetic wave reflecting plate 2 in this order as shown in FIG. 1. The total thickness (excluding the surface dielectric layer 7) of the electromagnetic wave absorber 1 is approximately 2.5 mm. In this example, the surface layer 7 with a thickness of 1.8 mm is provided and its complex relative dielectric constant (real part) ∈ is 4 (2.4 GHz). More specifically, in this example, the surface layer 7 is also a loss material.

Figure 15:
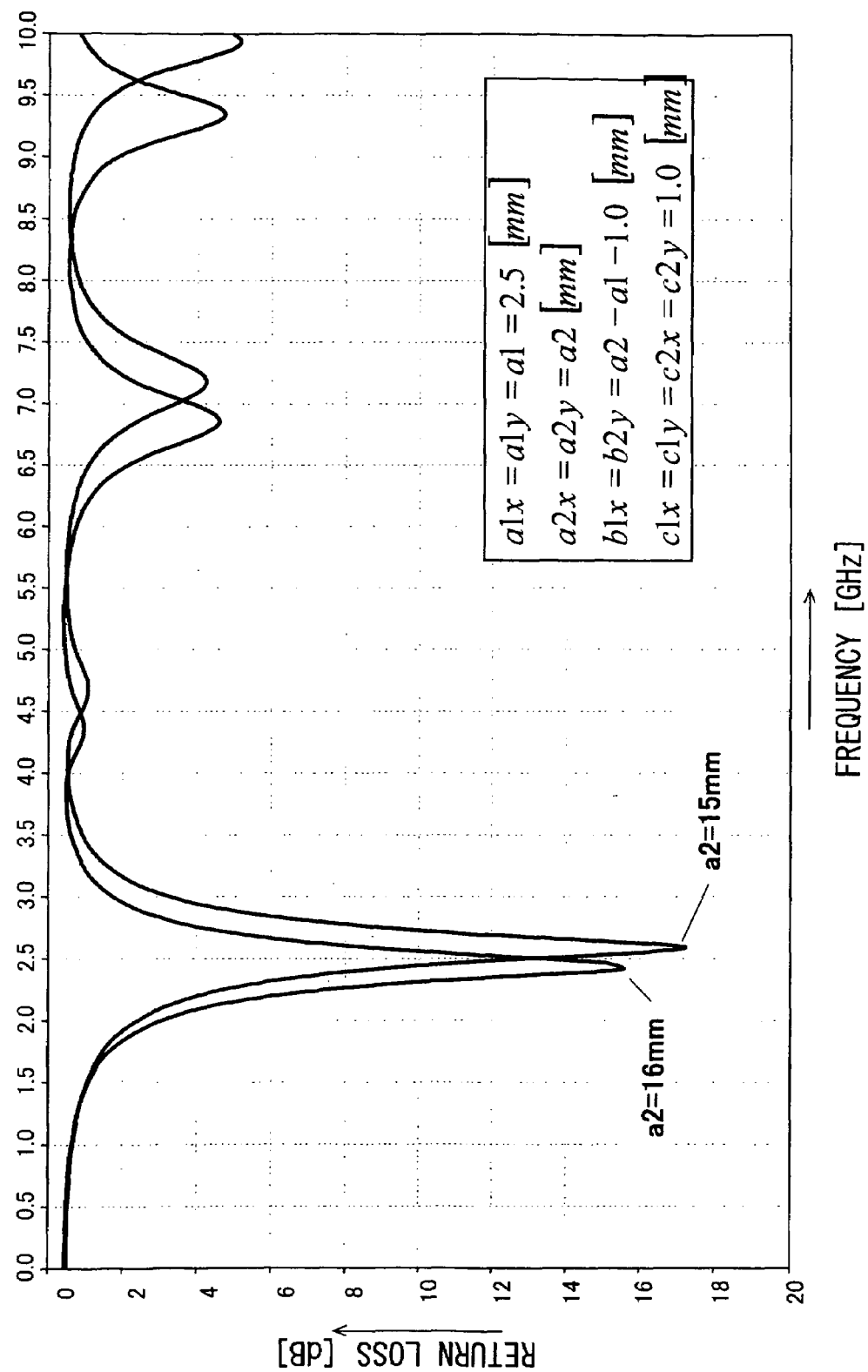
FIG. 15 is a graph showing the property of absorbing electromagnetic waves (calculated values) of the electromagnetic wave absorber 1 in Example 1.

FIG. 15 is a graph showing the property of absorbing electromagnetic waves of the electromagnetic wave absorber 1 in Example 1. In FIG. 9, the horizontal axis indicates the frequency of electromagnetic waves and the vertical axis indicates the reflection property illustrating the absorbing ability of electromagnetic waves. FIG. 9 shows the results of a simulation (using electromagnetic analysis software Microstripes (registered trademark)) in the case of vertical incidence when changing the length $b2x$, $b2y$ of the shaped portion 14, 15, and also changing items that depend on the length. In FIG. 9, the lengths $b2x$ and $b2y$ of the shaped portions 14 and 15 are equivalent to each other and thus indicated by "b2".

As shown in the results, while the total thickness of the electromagnetic wave absorber 1 is reduced to approximately 2.5 mm, it is possible to obtain the electromagnetic wave absorber 1 with an absorption property of 15 dB or more, in other words, with a reflection coefficient of −15 dB or less in the case of vertical incidence.

FIGS. 16(1) and 16(2) are graphs showing the results of a measurement using a free space method. The ability to absorb electromagnetic waves is based on the free space method. The free space method is a method for obtaining the complex relative dielectric constant and the complex relative permeability of a material by irradiating the electromagnetic wave absorber 1 that is a measurement sample placed in a free space with plane waves, and by measuring the reflection coefficient and the transmission coefficient at the time while changing the frequency, the incident angle, and the polarization. The absorption of electromagnetic waves of the electromagnetic wave absorber 1 is calculated based on the thus obtained complex relative dielectric constant and complex relative permeability. At that time, the measurement is performed at TE waves and TM waves. The equipment used herein was a network analyzer (product name: HP8722D, produced by Agilent Technologies). A double-ridged antenna was used as an antenna. The sizes of sides of rectangular materials serving as the measurement sample that is a radio wave absorber are 500×500 (mm) and 1000×1000 (mm).

When the element receiving means 100 having the first conductor element group 12 including the cross conductor element 30 and the quadrangular conductor element 31, in other words, the first conductor element layer 6 having the first conductor element group 12 was provided in this manner, the total thickness of the electromagnetic wave absorber 1 for the 2.4 GHz band was reduced to approximately 2.5 mm, although the total thickness could not be 4 mm or less in order to achieve an absorption property of 15 dB or more (vertical incidence) with patterns of conventional techniques (JP-A 06-164184, Japanese Patent No. 3076473 (JP-A 06-244583), Japanese Patent No. 3209456 (JP-A 06-140787), Japanese Patent No. 3209453 (JP-A 06-45782), JP-A 06-252582, JP-A 06-224568, JP-A 09-148782, JP-A 10-224075, JP-A 11-204984, JP-A 11-195890, and JP-A 2003-243876), patterns made only of cross-shaped portions and patterns made only of closed loops (□).

It is clear that the electromagnetic wave absorber 1 achieves an absorption property of 10 dB or more also with respect to the frequency (2.4 GHz) used in wireless LANs, and thus the electromagnetic wave absorber 1 is useful. Moreover, the electromagnetic wave absorber 1 can be formed thin as described above, and the weight is as light as 3.6 kg/m². Since the total thickness can be reduced, cutting on the spot with a simple tool is possible, and thus an excellent processability is attained. Furthermore, an excellent tear strength of 78 N/mm (JIS K 6254) is attained.

Example 2

Figure 17:
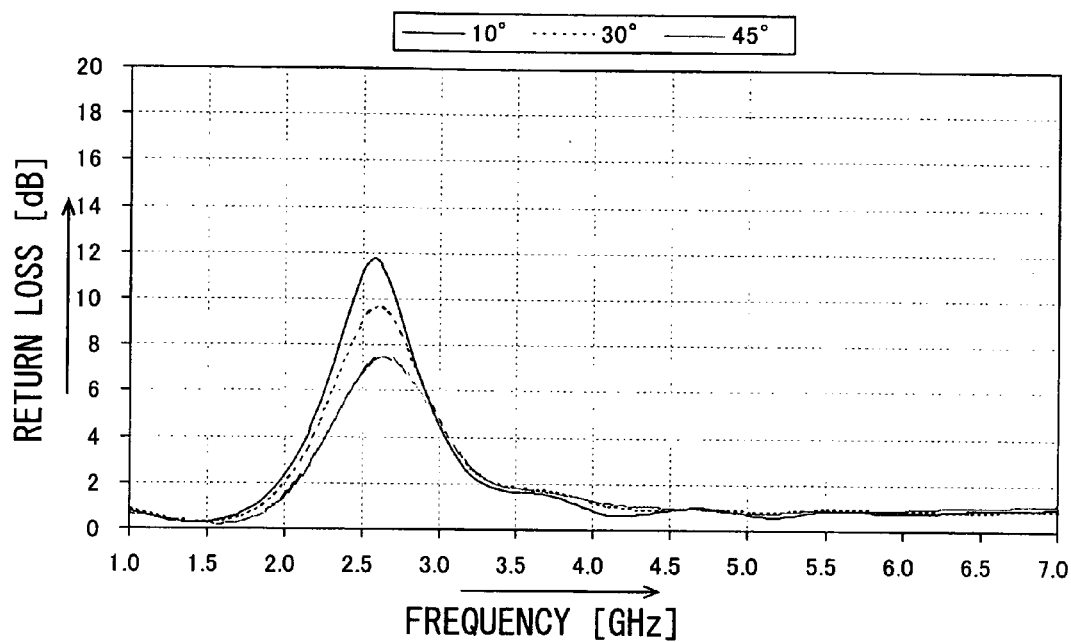
FIG. 17 is a graph showing the property of absorbing electromagnetic waves (measured values) of the electromagnetic wave absorber 1 in Example 2.

In the configuration of Example 2, the first conductor element layer 6 in which the shape of conductor elements is the same as that in Example 1 is used, and the second conductor element layer 4 is not used. FIG. 17 is a graph showing the results obtained with the configuration without the second conductor element layer 4. The first loss material layer 5 is constituted by two layers, including the layer closer to the first conductor element layer 6 that is 0.5 mm of PVC (vinyl chloride resin) to which ferrite and carbon black have been added, and 2 mm of PET to which ferrite has not been added, and the electromagnetic wave absorber 1 with a total thickness of 2.5 mm is thus configured. In the PVC layer, the dielectric constant is 16 in the real part and 3 in the imaginary part (2.4 GHz), and the permeability is 1.43 in the real part and 0.5 in the imaginary part (2.4 GHz). In the PET, the dielectric constant is 3.1 (2.4 GHz), and the permeability is 1 in the real part and 0 in the imaginary part (2.4 GHz).

As shown in the results, while the total thickness of the electromagnetic wave absorber 1 is reduced to approximately 2.5 mm, it is possible to obtain the electromagnetic wave absorber 1 with an absorption property of 10 dB or more, in other words, with a reflection coefficient of −10 dB or less in the case of vertical incidence.

The electromagnetic wave absorber 1 can be formed thin as described above, and the weight is as light as 3.3 kg/m². Furthermore, cutting on the spot with a simple tool is possible, and thus an excellent processability is attained. Furthermore, an excellent tear strength of 59 N/mm (JIS K 6254) is attained.

Example 3

Figure 18:
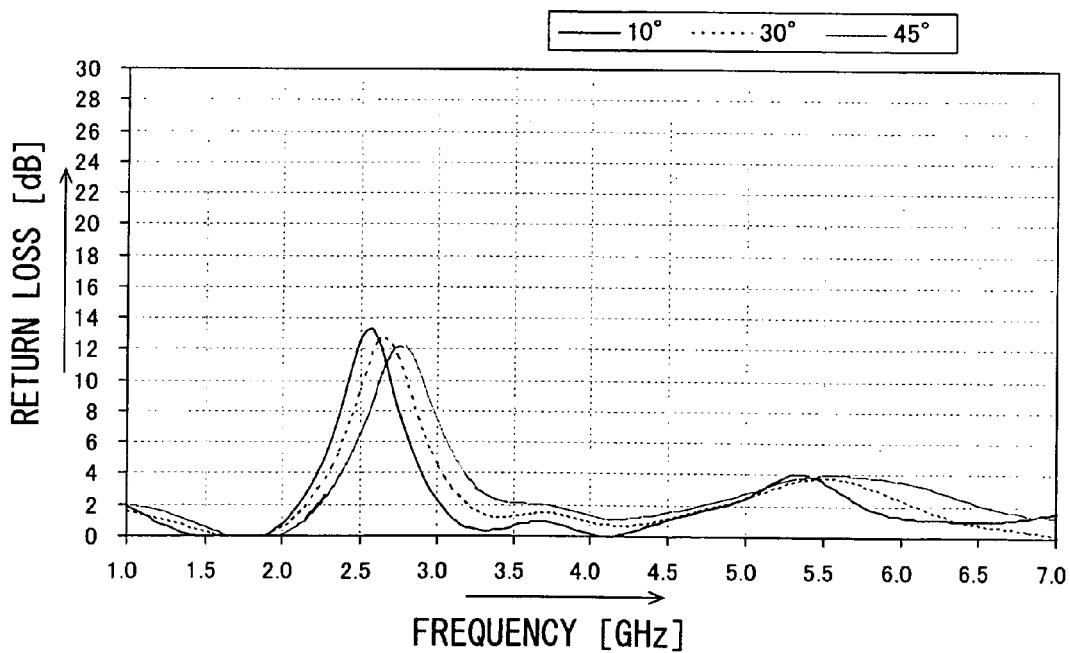
FIG. 18 is a graph showing the property of absorbing electromagnetic waves (measured values) of the electromagnetic wave absorber 1 in Example 3.

In the configuration of Example 3, the first conductor element layer 6 in which the shape of conductor elements is the same as that in Example 1 is used, and the second conductor element layer 4 is not used. FIG. 18 is a graph showing the results obtained with the configuration without the second conductor element layer 4. The first loss material layer 5 is constituted by two layers, including the layer closer to the first conductor element layer 6 that is 0.5 mm of PVC (vinyl chloride resin) to which ferrite and carbon black have been added, and 1 mm of PVC to which ferrite has not been added, and the electromagnetic wave absorber 1 with a total thickness of 1.5 mm is thus configured. In the PVC layer, the dielectric constant is 16 in the real part and 3 in the imaginary part (2.4 GHz), and the permeability is 1 in the real part and 0 in the imaginary part (2.4 GHz). In the PET, the dielectric constant is 3.1 (2.4 GHz), and the permeability is 1 in the real part and 0 in the imaginary part (2.4 GHz).

As shown in the results, while the total thickness of the electromagnetic wave absorber 1 is reduced to approximately 1.5 mm, it is possible to obtain the electromagnetic wave absorber 1 with an absorption property of 10 dB or more, in other words, with a reflection coefficient of −10 dB or less in the case of vertical incidence.

The electromagnetic wave absorber 1 can be formed thin as described above, and the weight is as light as 2.3 kg/m². Furthermore, cutting on the spot with a simple tool is possible, and thus an excellent processability is attained. Furthermore, an excellent tear strength of 53 N/mm (JIS K 6254) is attained.

Example 4

Figure 19:
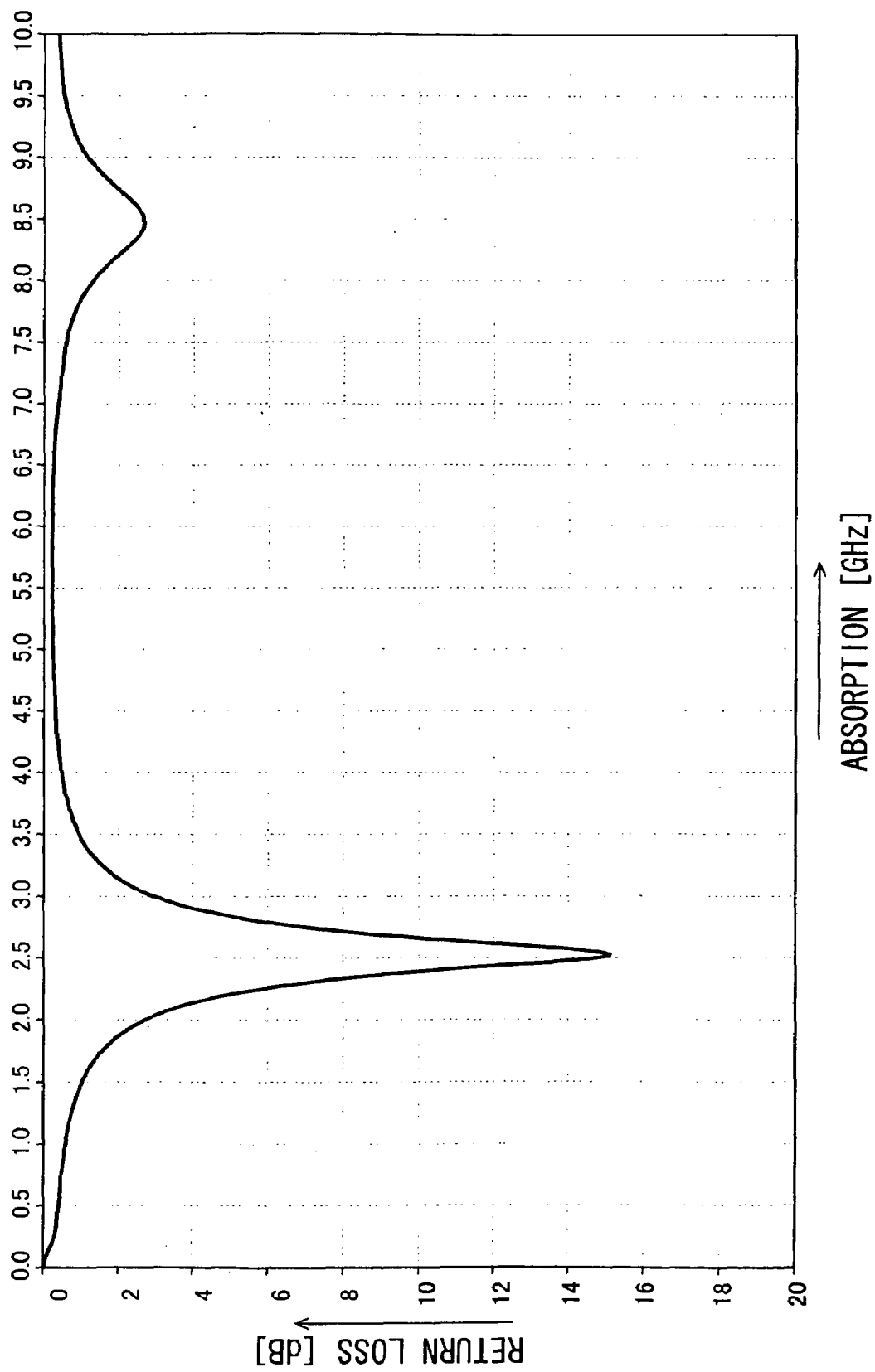
FIG. 19 is a graph showing the property of absorbing electromagnetic waves (calculated values) of the electromagnetic wave absorber 1 in Example 4.

In the configuration of Example 4, the first conductor element layer 6 in which the shape of conductor elements is the same as that in Examples 1 and 2 is used, and the second conductor element layer 4 is not used. FIG. 19 is a graph showing the results of a simulation performed with the configuration without the second conductor element layer 4. The first loss material layer 5 is constituted by one layer that is 2.5 mm of EVA resin to which ferrite has not been added, and the electromagnetic wave absorber 1 with a total thickness of 2.5 mm is thus configured. In the EVA resin, the dielectric constant is 2.5 (2.4 GHz), and the permeability is 1 (2.4 GHz).

As shown in the results, while the total thickness of the electromagnetic wave absorber 1 is reduced to approximately 2.5 mm, it is possible to obtain the electromagnetic wave absorber 1 with an absorption property of 10 dB or more, in other words, with a reflection coefficient of −10 dB or less in the case of vertical incidence.

The electromagnetic wave absorber 1 can be formed thin as described above, and the weight is as light as 2.9 kg/m². Furthermore, cutting on the spot with a simple tool is possible, and thus an excellent processability is attained. Furthermore, an excellent tear strength of 56 N/mm (JIS K 6254) is attained.

Comparative Example 1

A pattern in a loop structure was used instead of the first conductor element layer 6. In loops (squares), the size of one side of the outer peripheral portion is a5=a6=10 mm, the line width of shaped portions 24 and 25 that are conductor portions of the closed loop is b5=b6=1 mm, and the spacing between the loops is c5=c6=12 mm. Furthermore, the first loss material layer 5 is constituted by one layer, and 3 mm of magnetic rubber (fabricated by a process in which 100 parts by weight of chloroprene rubber, 8 parts by weight of Ketjenblack EC (product name, produced by LION AKZO CO., LTD.) as a dielectric loss material, and 100 parts by weight of powder of ferrite (product name: KNS-415, produced by TODA KOGYO CORP.) as a magnetic loss material are kneaded, and then vulcanized and molded into a sheet) is used. (In the magnetic rubber, the relative dielectric constant in the real part is 14 and the relative dielectric constant in the imaginary part is 2, based on the coaxial cylinder method (S-parameter method).) As the loss material layer 3, a polyethylene foam with a thickness of 1.5 mm was used.

Figure 20:
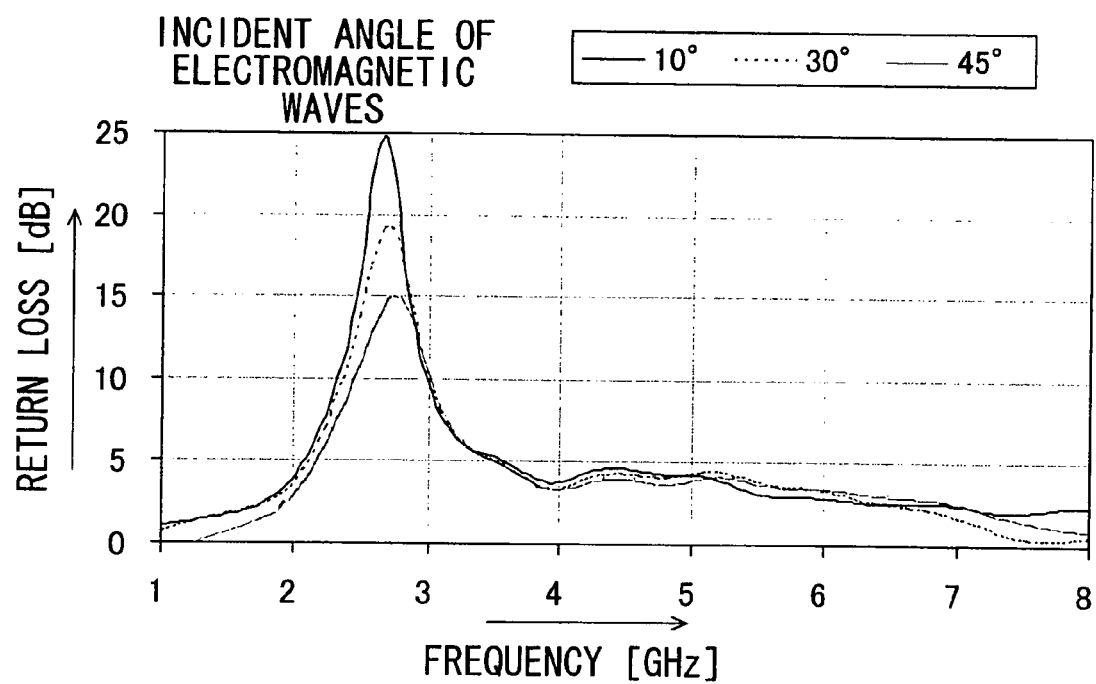
FIG. 20 is a graph showing the property of absorbing electromagnetic waves (measured values) of the electromagnetic wave absorber 1 in Comparative Example 1.

Although a high absorbing ability was observed (FIG. 20) also in this comparative example, the total thickness of the electromagnetic wave absorber 1 was as thick as 4.5 mm, and the weight was as heavy as 7 kg/m², and as a result, the flexibility was poor and the workability was poor. Embodiments of the invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

INDUSTRIAL APPLICABILITY

According to at least one embodiment of the invention, by receiving electromagnetic waves using element receiving means with a high receiving effect, it is possible to collect electromagnetic waves at a higher collecting efficiency than that of radio wave absorbers using patterned layers disclosed in conventional techniques (JP-A 06-164184, Japanese Patent No. 3076473 (JP-A 06-244583), Japanese Patent No. 3209456 (JP-A 06-140787), Japanese Patent No. 3209453 (JP-A 06-45782), JP-A 06-252582, JP-A 06-224568, JP-A 09-148782, JP-A 10-224075, JP-A 11-204984, JP-A 11-195890, and JP-A 2003-243876). Accordingly, it is possible to improve the ability to absorb electromagnetic waves, thereby realizing the electromagnetic wave absorber that is thin, light, soft, and excellent in the strength and workability while having a high ability to absorb electromagnetic waves. When a pattern is regarded as a receiving element, it is possible to design the absorber having the ability to absorb electromagnetic waves in combination with a different type of material such as a building interior material, and thus the absorber can be easily designed and produced as an interior material and the like.

Furthermore, by forming corner portions in the shape of arcs, it is possible to improve the absorption efficiency of electromagnetic waves with the same frequency as the corresponding resonant frequencies. Accordingly, it is possible to realize the electromagnetic wave absorber that is thin and has a high absorption efficiency.

Furthermore, according to at least one embodiment of the invention, a novel combination of conductor elements is proposed based on a calculation using the FDTD analysis method. As a result, it is possible to make a (magnetic) loss material layer thinner than that in conventional electromagnetic wave absorbers using patterns, and thus the total thickness of the electromagnetic wave absorber can be further reduced.

Furthermore, according to at least one embodiment of the invention, it is possible to prevent the resonant frequencies of the conductor elements from being changed by the influence of a location at which the electromagnetic wave absorber is disposed.

Furthermore, according to at least one embodiment of the invention, it is possible to increase the conductivity of the conductor elements and to improve the receiving efficiency.

Furthermore, according to at least one embodiment of the invention, it is possible to stably attain a conductivity of 10,000 S/m or more in the conductor elements.

Furthermore, according to at least one embodiment of the invention, the thickness is 0.1 mm or more and 4 mm or less. Accordingly, it is possible to realize the electromagnetic wave absorber that is thin, light, highly flexible, and excellent in the strength, and thus it is possible to realize the electromagnetic wave absorber that can be easily handled, is excellent in the workability, and has less limitation regarding the arrangement location.

Furthermore, according to at least one embodiment of the invention, the mass is 0.2 kg/m² or more and 5 kg/m² or less. Accordingly, it is possible to realize the electromagnetic wave absorber that is thin, light, highly flexible, and excellent in the strength, and thus it is possible to realize the electromagnetic wave absorber that can be easily handled, is excellent in the workability, and has less limitation regarding the arrangement location.

Furthermore, according to at least one embodiment of the invention, cross conductor elements and quadrangular conductor elements are provided, and the size of the conductor elements are optimized such that the conductor elements resonate with electromagnetic waves that are to be absorbed. Accordingly, it is possible to realize element receiving means for efficiently absorbing electromagnetic waves.

Furthermore, according to at least one embodiment of the invention, an optimum (high) receiving efficiency is provided in the combination of the cross conductor elements and the quadrangular conductor elements. Accordingly, it is possible to realize the electromagnetic wave absorber with a high absorption efficiency.

Furthermore, according to at least one embodiment of the invention, it is possible to lower the resonant frequencies by adjusting the size of the spacings between the conductor elements, and thus the total thickness of the electromagnetic wave absorber can be reduced.

Furthermore, according to at least one embodiment of the invention, the property values of loss materials are determined so as to improve the absorption efficiency of electromagnetic waves, and thus it is possible to efficiently absorb electromagnetic waves.

Furthermore, according to at least one embodiment of the invention, the flame resistance, the quasi-incombustibility, or the incombustibility is provided, and thus the absorber can be preferably used in or laminated on a building interior material.

Furthermore, according to at least one embodiment of the invention, it is possible to absorb electromagnetic waves at a high absorption efficiency using the electromagnetic wave absorber.

The invention claimed is:

1. An electromagnetic wave absorber, comprising:
   an element receiving layer provided with a first type and a second type of conductor elements having resonant frequencies, to perform the same or different receiving operations, each of the element receiving layer conductor elements being disposed on a surface of the element receiving layer on a side from an incoming direction of electromagnetic waves, to be spaced away from each other; and
   a loss material for causing energy loss to electromagnetic waves proximate to the element receiving layer,
   wherein the first type of the conductor elements are cross conductor elements that are cross-shaped planes, and the second type of the conductor elements are quadrangular conductor elements that are quadrangle-shaped planes,
   the cross conductor elements and the quadrangular conductor elements are arranged in a direction intersecting the incoming direction of electromagnetic waves,
   the cross conductor elements are arranged in a regular manner,
   the quadrangular conductor elements are arranged in areas surrounded by the cross conductor elements so as to fill in the areas,
   each corner of the quadrangular conductor elements is arc shaped, the arc shape having a radius of curvature corresponding to the resonant frequencies, and at least each concave corner of the cross conductor elements is arc shaped, the arc shape having a radius of curvature corresponding to the resonant frequencies.

2. The electromagnetic wave absorber of claim 1, wherein the conductor elements are arranged also in the incoming direction of electromagnetic waves, in addition to the direction intersecting the incoming direction of electromagnetic waves.

3. The electromagnetic wave absorber of claim 1, further comprising electromagnetic wave reflecting means for reflecting electromagnetic waves, disposed on a side opposite to a side from an incoming direction of electromagnetic waves with respect to the element receiving means.

4. The electromagnetic wave absorber of claim 1, wherein a conductivity of the conductor elements is at least 10,000 S/m.

5. The electromagnetic wave absorber of claim 1, wherein the conductor elements are made of metal.

6. The electromagnetic wave absorber of claim 1, wherein the electromagnetic wave absorber is formed in the shape of a sheet having a thickness of at least 0.1 mm and at most 4 mm.

7. The electromagnetic wave absorber of claim 1, wherein the electromagnetic wave absorber is formed in the shape of a sheet having a mass per unit area of at least 0.2 kg/m$^2$ and at most 5 kg/m$^2$.

8. The electromagnetic wave absorber of claim 1, wherein the cross conductor elements are arranged such that radially extending portions are faced with each other, and the quadrangular elements are formed in a shape corresponding to the areas surrounded by the cross conductor elements.

9. The electromagnetic wave absorber of claim 1, wherein a size of a spacing between the conductor elements is determined so as to lower the resonant frequencies of the conductor elements.

10. The electromagnetic wave absorber of claim 1, wherein a property value of the loss material is determined based on the resonant frequencies of the conductor elements so as to improve an absorption efficiency of electromagnetic waves with a same frequency as the resonant frequencies.

11. The electromagnetic wave absorber of claim 1, wherein the electromagnetic wave absorber is made flame resistant, quasi-incombustibile, or incombustibile.

12. The electromagnetic wave absorber of claim 2, further comprising electromagnetic wave reflecting means for reflecting electromagnetic waves, disposed on a side opposite to a side from an incoming direction of electromagnetic waves with respect to the element receiving means.

13. The electromagnetic wave absorber of claim 2, wherein a conductivity of the conductor elements is at least 10,000 S/m.

14. The electromagnetic wave absorber of claim 2, wherein a property value of the loss material is determined based on the resonant frequencies of the conductor elements so as to improve an absorption efficiency of electromagnetic waves with a same frequency as the resonant frequencies.

15. The electromagnetic wave absorber of claim 2, wherein the electromagnetic wave absorber is made flame resistant, quasi-incombustibile, or incombustibile.

16. A method of absorbing electromagnetic waves, the method comprising:
    using an electromagnetic wave absorber to absorb electromagnetic waves, the electromagnetic wave absorber including,
    an element receiving layer provided with a first type and a second type of conductor elements having resonant frequencies, to perform the same or different receiving operations, the element receiving layer conductor elements being disposed on a surface of the element receiving layer on a side from an incoming direction of electromagnetic waves, to be spaced away from each other, and
    a loss material for causing energy loss to electromagnetic waves proximate to the element receiving layer,
    wherein the first type of the conductor elements are cross conductor elements that are cross-shaped planes, and the second type of the conductor elements are quadrangular conductor elements that are quadrangle-shaped planes,
    the cross conductor elements and the quadrangular conductor elements are arranged in a direction intersecting the incoming direction of electromagnetic waves,
    the cross conductor elements are arranged in a regular manner,
    the quadrangular conductor elements are arranged in areas surrounded by the cross conductor elements so as to fill in the areas,
    each corner of the quadrangular conductor elements is arc shaped, the arc shape having a radius of curvature corresponding to the resonant frequencies, and
    at least each concave corner of the cross conductor elements is arc shaped, the arc shape having a radius of curvature corresponding to the resonant frequencies.

17. The method of absorbing electromagnetic waves of claim 16, wherein the conductor elements are also arranged in the incoming direction of electromagnetic waves, in addition to the direction intersecting the incoming direction of electromagnetic waves.

18. The electromagnetic wave absorber of claim 1, the element receiving layer further comprising a third type of conductor element having a resonant frequency to perform the same or different receiving operation, spaced away from the first type and second type of conductor elements.

19. The electromagnetic wave absorber of claim 1, wherein all corners are arc-shaped, with a radius of curvature corresponding to the resonant frequencies.

* * * * *